United States Patent [19]

Noguchi et al.

[11] Patent Number: 5,578,418
[45] Date of Patent: Nov. 26, 1996

[54] LIQUID JET RECORDING HEAD AND RECORDING APPARATUS HAVING SAME

[75] Inventors: Hiromichi Noguchi, Atsugi; Tadayoshi Inamoto, Machida; Megumi Saito, Kawasaki, all of Japan

[73] Assignee: Canon Kabushiki Kaisha, Tokyo, Japan

[21] Appl. No.: 406,800

[22] Filed: Mar. 20, 1995

Related U.S. Application Data

[63] Continuation of Ser. No. 267,310, Jun. 29, 1994, abandoned, which is a continuation of Ser. No. 22,403, Feb. 24, 1993, abandoned, which is a continuation of Ser. No. 497,095, Mar. 21, 1990, abandoned.

[51] Int. Cl.$^6$ .............................. B41J 2/16; C08L 51/00; C08L 63/00; G03F 7/004
[52] U.S. Cl. ............ 430/280.1; 522/25; 522/31; 522/102; 522/109; 522/112; 522/129; 346/140.1
[58] Field of Search .................... 430/280.1; 522/31, 522/102, 109, 25, 112, 129; 525/65, 80, 84, 85, 77, 75, 108; 346/140.1

[56] References Cited

U.S. PATENT DOCUMENTS

| | | |
|---|---|---|
| 4,417,251 | 11/1983 | Sugitani . |
| 4,509,063 | 4/1985 | Sugitani et al. . |
| 4,657,631 | 4/1987 | Noguchi . |
| 4,688,052 | 8/1987 | Inamoto et al. . |
| 4,688,053 | 8/1987 | Noguchi et al. .................. 522/149 |
| 4,688,054 | 8/1987 | Inamoto et al. . |
| 4,688,055 | 8/1987 | Noguchi et al. . |
| 4,688,056 | 8/1987 | Noguchi et al. .................. 522/87 |
| 4,775,445 | 10/1988 | Noguchi . |

FOREIGN PATENT DOCUMENTS

| | | |
|---|---|---|
| 0209803 | 1/1987 | European Pat. Off. . |
| 0307918 | 9/1988 | European Pat. Off. . |
| 77014279 | 2/1977 | Japan . |
| 77014278 | 2/1977 | Japan . |
| 86283646 | 12/1986 | Japan . |
| 86283645 | 12/1986 | Japan . |

*Primary Examiner*—Susan W. Berman
*Attorney, Agent, or Firm*—Fitzpatrick, Cella, Harper & Scinto

[57] ABSTRACT

A process is disclosed for producing a liquid jet recording head comprising applying an active energy-curing resin composition onto at least a part of a surface of a first member for forming a wall of the liquid path; exposing the applied active energy-ray-curing resin to an active energy ray selected from the group consisting of an ultraviolet-ray having an intensity of 1 mW/cm$^2$ to 100 mW/cm$^2$ and an electron beam having an intensity of 0.5M Rad to 20M Rad; and providing a second member on the exposed active energy-ray-curing resin composition.

31 Claims, 8 Drawing Sheets

LIQUID JET RECORDING HEAD AND RECORDING APPARATUS HAVING SAME

This application is a continuation of application Ser. No. 08/267,310 filed Jun. 29, 1994, now abandoned, which is a continuation of Ser. No. 08/022,403, filed Feb. 24, 1993, now abandoned, which is a continuation of application Ser. No. 07/497,095, filed Mar. 21, 1990, now abandoned.

BACKGROUND OF THE INVENTION

1. Field of the Invention

This invention relates to a liquid jet recording head and a recording apparatus by use thereof, particularly to a liquid jet recording head to be used for the liquid jet recording system which performs recording by discharging liquid for recording such as ink, and the like to attach it onto a recording medium such as paper, and a recording apparatus by use thereof.

2. Related Background Art

The liquid jet recording system which performs recording by discharging liquid for recording such as ink and the like to attach it onto a recording medium such as paper is extremely small to negligible extent in generation of noise during recording, and also enables high speed recording. Yet, it is attracting attention as the recording system capable of performing recording on a plain paper without requiring a special treatment such as fixing, and various types have been recently actively studied.

The recording head of the recording apparatus to be used in the liquid jet recording system is generally constituted by having an orifice (discharge opening) for discharging liquid for recording, a liquid path communicated with the orifice and having a portion at which the energy for discharging liquid for recording acts on the liquid for recording, and a liquid chamber for storing the liquid for recording to be supplied to the liquid path.

The energy for discharging the liquid for recording during recording is mostly generated by a discharge energy generating element of various types such as heat-generating element, a piezoelectric element arranged at a predetermined position of the portion (energy acting portion) where the discharge energy is acted on the liquid for recording constituting a part of the liquid path.

As the method for preparing a liquid jet recording head of such constitution, there may be included, for example, the method including the steps of forming a fine groove on a flat plate such as of glass, metal, and the like by cutting, etching, and the like and further forming a liquid path by bonding another appropriate plate to the flat plate having such groove formed thereon to form a liquid path, or the method including the steps of forming a wall of a photosensitive resin cured on a substrate having, for example, a discharge energy generating element arranged thereon by photolithographic step to provide a groove which becomes the liquid path on the substrate and bonding another flat plate (cover) to the grooved plate thus formed to form a liquid path (for example, U.S. Pat. No. 4,417,251).

Among these methods for preparation of liquid jet recording head, the latter method of employing a photosensitive resin can finely work the liquid path with better precision, and with better yield, as compared with the former method, and also bulk production can be realized more easily, and therefore it has the advantage that a liquid jet recording head with better quality and lower cost can be provided.

As the photosensitive resin for preparation of such a recording head, there have been used those which have been used for pattern formation in printing plate, print wiring, and the like, those known as the coating material or adhesive of the photocurable type to be used for glass, metal, ceramics, etc., and also primarily resins of the dry film type from the aspect of working efficiency.

In the recording head utilizing a cured film of a photosensitive resin for a part of the constitution, for obtaining excellent characteristics such as high degree of recording characteristic, durability and reliability, and the like, the photosensitive resin to be used is required to have such characteristics as:

(1) particularly excellent adhesion to the substrate, etc. as the cured film;

(2) excellent mechanical strength and durability when cured;

(3) excellent sensitivity and resolution during patterning by use of pattern exposure.

Whereas, few of the known photosensitive resins which have been employed for formation of liquid jet recording heads up to date fully satisfied all of the characteristics as mentioned above under the present situation.

As the photosensitive resin for recording heads, for example, those employed for pattern formation in printing plate, print wiring, etc., although excellent in sensitivity and resolution, are not satisfactory in such demands as adhesion and close contact with glass, ceramics, plastic films, etc. used as a substrate in most cases, and also sometimes insufficient in mechanical strength or durability when cured. For this reason, in the step of preparing a recording head or as accompanied with use of a recording head, there may sometimes ensue such problem that deformation, peel-off from the substrate, damage of the resin cured film which may be a cause for remarkable damage of the reliability of the recording head such as lowering in recording characteristics by inteference of the flow of the liquid for recording within the liquid path, or making the liquid discharge direction unstable.

On the other hand, those known as the photocurable type coating material or adhesive to be used for glass, metal, ceramics, etc., although having such advantages that they are excellent in close contact or adhesion with the substrates comprising these materials, and also that sufficient mechanical strength and durability are obtained when cured, are not satisfactory in the demands of sensitivity and resolution in most cases, whereby an exposure device of higher intensity or prolonged exposure operation are required. Also, in their characteristics, no highly precise high density pattern can be hardly obtained with good resolution, and therefore such resins have the problem that they are not suitable for recording heads for which fine precise working is particularly required.

Also, in the photosensitive resin compositions utilized for various uses of the prior art, adhesion with metal, etc. has been improved by addition of various additives such as heterocyclic compounds having complex forming ability with metals, etc., or coupling agents, etc. into the photosensitive resin composition (Japanese Patent Publication Nos. 51-5934, 58-24035, etc.). However, this method had the problem that the above additive aids, etc. caused such phenomena as oxidation and corrosion of the composition, etc. after elapse of a long term.

On the other hand, for the purpose of obtaining a cured composition having sufficient adhesion without addition of such additive aids, a polymeric substance comprising a graft copolymer having polar group in the branched chains is disclosed in Japanese Laid-open Patent Application Nos. 61-283645, 61-283646. The active energy-ray-curing resin composition containing the polymeric substance (graft copolymerized polymer) disclosed in the applications has the advantage that improvement of adhesion, further improvement of durability of the coating can be realized without relying on additive aids, etc.

However, in this composition, there still remained the problem that difficulty is accompanied with the molecular design of the polymeric substance (graft copolymerized polymer). More specifically, there is generally accompanied technical difficulty in synthesizing a graft copolymer so that its whole weight average molecular weight may become a suitable desired molecular weight over a wide range (about 50,000 to 350,000) while maintaining the molecular weight of the graft chain and its content at constant levels.

Shortly speaking, for making good the developing characteristics during pattern formation, namely dissolving rate of the unpolymerized portion, swellability of the polymerized portion, and sensitivity, sharpness of pattern, resolution as the results of them, the average molecular weight of the polymeric substance must not be too small. In the graft copolymerized polymer, it is accompanied with difficulty from the point of steric hindrance in the synthetic technique at the present time to obtain an average molecular weight in conformity with the above-mentioned object by bonding a large number of graft chains having enough lengths to obtain effective adhesion to the trunk chain of a relatively larger molecular weight.

In other words, if the average molecular weight of the polymeric substance is too low, the developing characteristics of the pattern forming material by use thereof, namely dissolving Pate of the unpolymerized portion, swellability of the polymerized portion, and sensitivity, sharpness of pattern, control of resolution are limited to some extent.

Thus, the photosensitive resin composition to be used as the constituent material of a liquid jet recording head (ink jet recording head) is required to have characteristics of extremely high performance.

Specifically, the characteristics demanded for the photosensitive resin composition may be mentioned as follows:

(1) The composition should be such that when formed into a cured film, the film is completely or substantially free from dissolution into ink, and should not cause problems such as generation of a foreign matter which may cause clogging of discharge opening or liquid path or change in discharge characteristics by change in ink properties;

(2) The composition should be such that when formed into a cured film, the film causes no lowering in strength or change in dimensions as the structural material such as swelling, peel-off, generation of cracks by penetration of ink;

(3) The composition should be such that when applied as a cured film to a recording head in which particularly, heat energy is utilized as the liquid discharging energy, there occurs no deformation of the shape, etc. by the pressure for liquid discharging and the thermal shock and the like.

This is because the photosensitive resin composition (or its cured product) is constantly in contact with ink (water-soluble organic solvents of high polarity are used therein in most cases), whereby the problem will readily occur that residual soluble components are dissolved into ink.

Also, lowering in strength, change in dimensions as the structural material, in addition to giving great restrictions in design of ink, add great restrictions in durability, design of the recording head itself.

Further, due to the synergetic action of heat and pressure, there may be sometimes generated such problems as deformation, etching, etc. as the structural material.

SUMMARY OF THE INVENTION

The present invention has been accomplished in view of the problems as described above, and its object is to provide a recording head by use of an active energy-ray-curing resin composition, having sufficient adhesion without addition of additive aids, etc., excellent developing characteristics during pattern formation, and also characteristics readily controlled so as to give good characteristics as the constituent member of a liquid jet recording head, which is inexpensive and highly precise, high in reliability and excellent in durability, and a recording apparatus by use thereof.

Another object of the present invention is to provide a liquid jet recording head having a constitution with a liquid path finely worked with good precision and with good yield, and a recording apparatus by use of the head.

Still another object of the present invention is to provide a liquid jet recording head having high reliability and excellent durability also when formed into a multi-orifice, and a recording apparatus by use of the head.

Still another object of the present invention is to provide a recording head by use. of an active energy-ray-curing resin composition which, when formed into a cured film, is completely or substantially free from dissolution into ink, and does not cause problems such as generation of a foreign matter which may cause clogging of discharge opening or liquid path or change in discharge characteristics by change in ink properties, and a recording apparatus by use of the head.

Still another object of the present invention is to provide a recording head by use of an active energy-ray-curing resin composition which, when formed into a cured film, causes no lowering in strength or change in dimensions as the structural material such as swelling, peel-off, generation of cracks by penetration of ink as the cured film, and a recording apparatus by use of the head.

Still another object of the present invention is to provide a recording head by use of an active energy-ray-curing resin composition which, when applied as a cured film to a recording head in which particularly, heat energy is utilized as the liquid discharging energy, there occurs no deformation of the shape, etc. by the pressure for liquid discharging and the thermal shock and the like, and a recording apparatus by use of the head.

Still another object of the present invention is to provide a liquid jet recording head comprising a cured product of an active energy-ray-curing resin composition as a.t least a part of its constitution, said composition comprising:

(A) a graft copolymerized polymer having a number average molecular weight of 5,000 or more and a weight average molecular weight of 50,000 or less which comprises a trunk chain composed mainly of structural units derived from at least one monomer (hereinafter referred to as "monomer (a)") selected from the group consisting of alkyl methacrylates, acrylonitrile and stylena and has graft chains having structural units derived from at least one monomer (hereinafter referred to as "monomer (b)") selected from the group consisting of the monomers represented by the following formula x and other raonomers presented by the formula y:

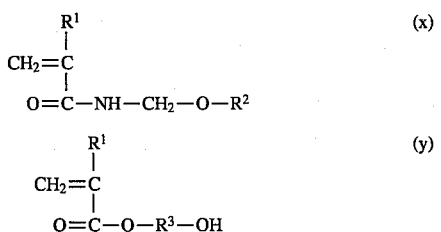

(x)

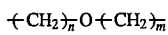

(y)

(wherein $R^1$ is hydrogen or an alkyl or hydroxyalkyl group having 1 to 3 carbon atoms, $R^2$ is hydrogen or an alkyl or acyl group having 1 to 4 carbon atoms which may have hydroxy group, $R^3$ is an alkyl group having 2 to 6 carbon atoms, a halogen-substituted alkyl group having 2 to 6 carbon atoms, an alkylether group represented by the formula:

$$+CH_2)_n\!\!-\!\!O+CH_2)_m$$

(wherein $2 \leq m+n \leq 6$, $n \neq 0$ and $m \neq 0$), or a phenylalkyl group represented by the formula:

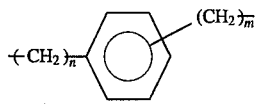

(wherein $2 \leq m+n \leq 4$, or the case where n=0 or m=0 is contained), added to said trunk chain;

(B) a linear polymer having a number average molecular weight of 50,000 or more and a weight average molecular weight of 350,000 or less and having a glass transition temperature of 60° C. or more which comprises structural units derived from at least one toohomer (hereinafter referred to as "monomer (c)") selected from the group consisting of methyl methacrylate, ethyl methacrylate, isobutyl methacrylate, t-butyl methacrylate, benzyl methacrylate, acrylonitile, isobornyl methacrylate, isobornyl acrylate, tricyclodecaneacrylate, tricyclodecane methacrylate, tricyclodecaneoxyethyl methacrylate, styrene, dimethylaminoethyl methacrylate and cyclohexyl methacrylate and other structural units derived from at least one monomer (hereinafter called monomer (b')) selected from the group consisting of the monomers represented by the formula (x) and the monomers represented by the formula (y) provided that the monomer (a) and the monomer (b') may have either the same composition or different compositions;

(C) an epoxy resin comprising at least a compound having one or more of epoxy groups in one molecule; and (D) a polymerization initiator capabale of generating a Lewis acid by irradiation of an active energy-ray.

Still another object of the present invention is to provide a liquid jet recording apparatus comprising a liquid jet recording head having a discharge opening for discharging recording liquid, a driving circuit for driving said recording head and platen, said liquid jet recording head comprising a cured product of an active energy-ray-curing resin composition as at least a part of its constitution, said composition comprising:

(A) a graft copolymerized polymer having a number average molecular weight of 5,000 or more and a weight average molecular weight of 50,000 or less which comprises a trunk chain composed mainly of structural units derived from at least one monomer (hereinafter referred to as "monomer (a)") selected from the group consisting of alkyl methacrylates, acrylonitrile and stylene and has graft chains having structural units derived from at least one monomer (hereinafter referred to as "monomer (b)") selected from the group consisting of the monomers represented by the following formula x and other monomers presented by the formula y:

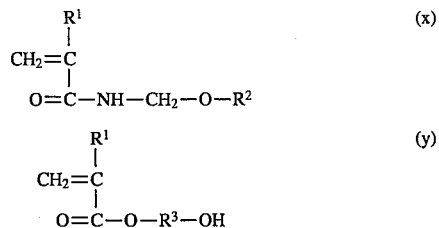

(x)

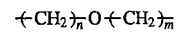

(y)

(wherein $R^1$ is hydrogen or an alkyl or hydroxyalkyl group having 1 to 3 carbon atoms, $R^2$ is hydrogen or an alkyl or acyl group having 1 to 4 carbon atoms which may have hydroxy group, $R^3$ is an alkyl group having 2 to 6 carbon atoms, a halogen-substituted alkyl group having 2 to 6 carbon atoms, an alkylether group represented by the formula:

$$+CH_2)_n\!\!-\!\!O+CH_2)_m$$

(wherein $2 \leq m+n \leq 6$, $n \neq 0$ and $m \neq 0$), or a phenylalkyl group represented by the formula:

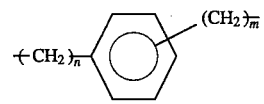

(wherein $2 \leq m+n \leq 4$, or the case where n=0 or m=0 is contained), added to said trunk chain;

(B) a linear polymer having a number average molecular weight of 50,000 or more and a weight average molecular weight of 350,000 or less and having a glass transition temperature of 60° C. or more which comprises structural units derived from at least one toohomer (hereinafter referred to as "monomer (c)") selected from the group consisting methyl methacrylate, ethyl methacrylate, isobutyl methacrylate, t-butyl methacrylate, benzyl methacrylate, acrylonitrile, isobornyl methacrylate, isobornyl acrylate, tricyclodecaneacrylate, tricyclodecane methacrylate, tricyclodecaneoxyethyl methacrylate, styrene, dimethylaminoethyl methacrylate and cyclohexyl methacrylate and other structural units derived from at least one monomer (hereinafter called monomer (b')) selected from the group consisting of the monomers represented by the formula (x) and the monomers represented by the formula (y) provided that the monomer (a) and the monomer (b') may have either the same composition or different compositions;

(C) an epoxy resin comprising at least a compound having one or more of epoxy groups in one molecule; and (D) a polymerization initiator capable of generating a Lewis acid by irradiation of an active energy-ray.

DESCRIPTION OF THE PREFERRED EMBODIMENTS

Figure 1A:
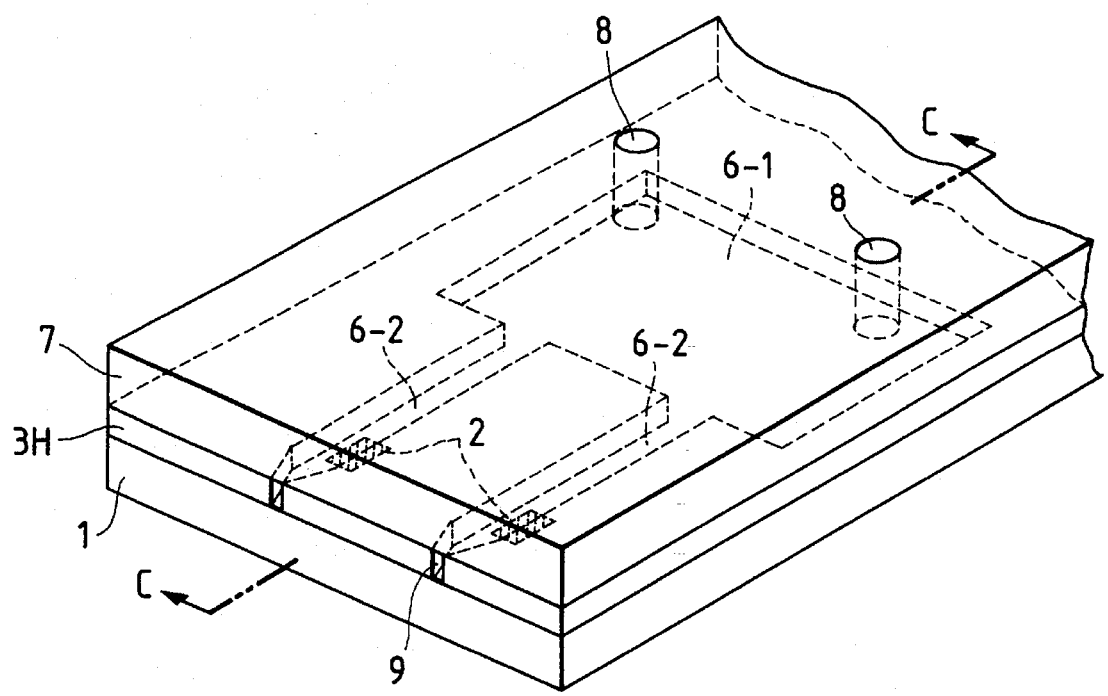
FIG. 1A to FIG. 6B are schematic diagrams for illustration of the liquid jet recording head of the present invention and a method for preparation thereof.

The liquid jet recording head can take various constitutions as desired, but the cured product of the resin composition as mentioned above is used as at least a part of its constitution.

Referring now to the drawings, an example of the liquid jet recording head of the present invention is described in detail.

Figure 1B:
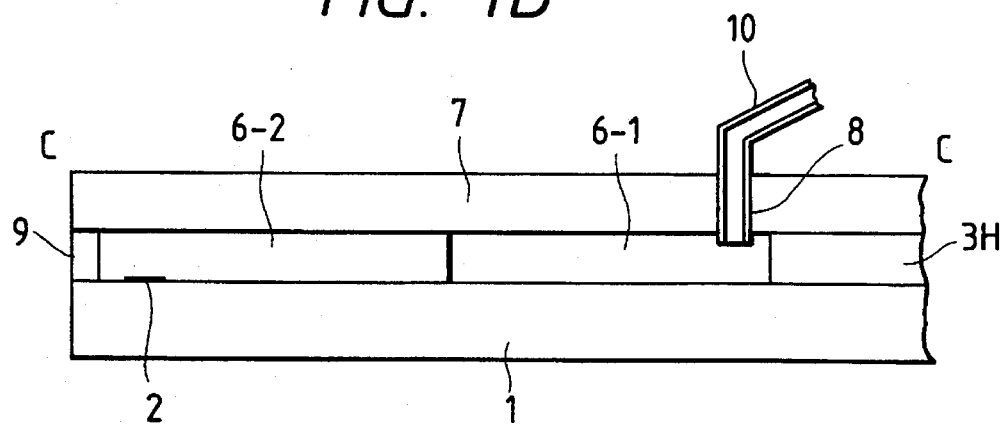

FIG. 1 is a preferable example of the liquid jet recording head of the present invention, FIG. 1A being a perspective view of its principal portion, FIG. 1B a sectional view cut along the line C—C in FIG. 1A.

The liquid jet recording head comprises basically a substrate 1, a liquid path wall 3H Comprising a resin cured film patterned to a predetermined shape and a cover 7 laminated on the liquid path wall 3H, and by these members are formed an orifice 9 for discharging liquid for recording, liquid paths 6-2 communicated to the orifice and having a portion at which the energy for discharging the liquid for recording acts on the liquid for recording and a liquid chamber 6-1 for storing the liquid for recording to be fed to the liquid paths. Further, to the thru-holes 8 provided at the cover are bonded feeding pipes for feeding the liquid for recording to the liquid chamber 6-1 externally of the recording head. In FIG. 1A, the feeding pipe 10 is omitted. Of course, it may be also directly communicated through the thru-hole 8 to the inner portion of the vessel for housing the liquid for recording.

During recording, the energy for discharging the liquid for recording is generated by applying a discharge signal as desired on the discharge energy generating elements 2 of various types such as heat-generating element, piezoelectric element, etc. arranged at predetermined positions of the portion where discharging energy is permitted to act on the liquid for recording constituting a part of the liquid path 6-2 through the wiring (not shown) connected to these elements.

The substrate 1 constituting the recording head of the present invention comprises glass, ceramics, plastic or metal, etc., and the generating elements 2 are arranged in desired number at predetermined positions. In the example in FIGS. 1A and 1B, two generating elements are provided, but the number and arrangement of the heat-generating elements may be suitably determined depending on the predetermined constitution.

The cover 7 comprises 8 flat plate of glass, ceramics, plastic or metal, etc., which is bonded onto the liquid path wall 3H by the bonding method by fusion or by use of an adhesive, and the thru-holes 8 for connecting the feeding pipes 10 are provided at predetermined positions.

In the recording head, the resin cured film patterned to a predetermined shape constituting the wall 3H of the liquid path 6-2 and the liquid chamber 6-1 is obtained by subjecting the layer comprising the active energy-ray-curing resin composition including the constituent components (A) to (D) as described above provided on the substrate 1 or on the cover 7 to patterning according to the photolithographic steps.

Having described above about an example using a cured film of the resin composition for the constitution of the liquid path wall 3H, the cured film (cured product) of the resin composition can be suitably utilized for other portions of the recording head.

Figure 7A:
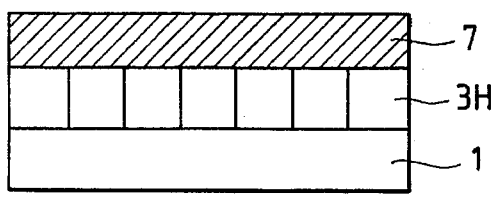
FIGS. 7A to 7H, FIGS. 10A and 10B are schematic lateral sectional views at the surface vertical to the liquid paths of the recording head showing the portions in which the resin cured film is used.
Figure 7E:
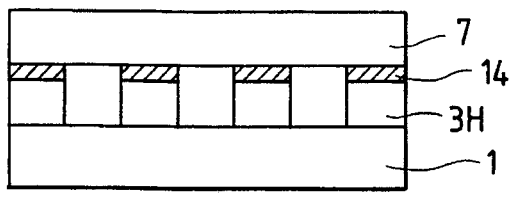
Figure 7B:
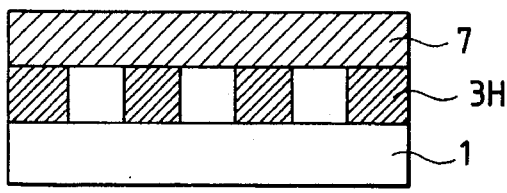
Figure 7F:
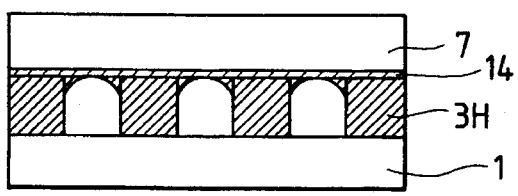
Figure 7C:
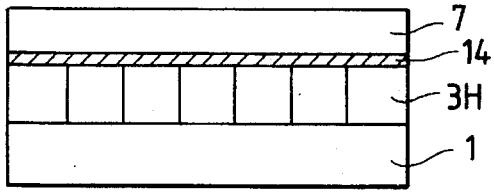
Figure 7G:
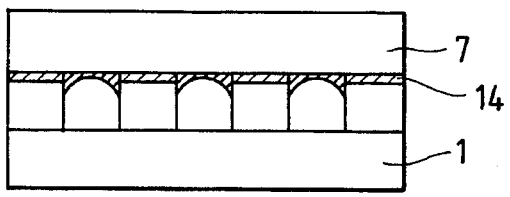
Figure 7D:
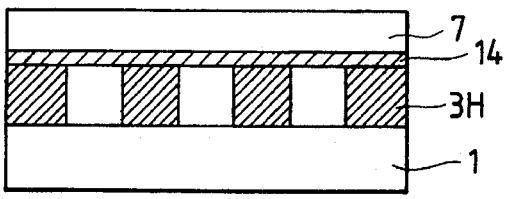
Figure 7H:
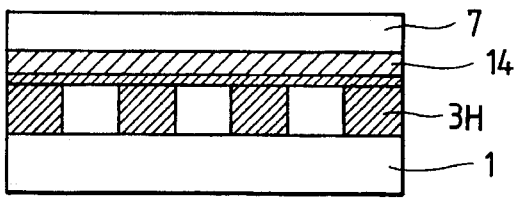

For example, as shown in FIGS. 7A to 7H represented as a partial section of a recording head vertical to the liquid paths, there can be mentioned utilization of:

1. as the cover 7 [FIG. 7A];
2. as the liquid path wall 3H and the cover 7 (in this case, the liquid path wall 3H and the cover 7 may be formed integrally, or may be also formed separately and then bonded) [FIG. 7B];
3. as the adhesive layers 14 between the liquid path wall 3H and the cover 7 formed from various resins, etc. [FIGS. 7C, 7E and 7G];
4. as the liquid path wall 3H and the adhesive layer 14 between the liquid path wall 3H and the cover 7 [FIGS. 7D and 7F]
5. as the liquid path wall 3H and the adhesive layers 14 between the liquid path wall 3H and the cover 7 (two-layer constitution) [FIG. 7H], or a combination of them. Among the above constitutions, for formation of the constitutions of FIGS. 7A to 7E, 7H and the liquid path wall 3H in FIG. 7F, those of the dry film type can be suitably used, while for the adhesive layer 14 in FIGS. 7F and 7G, those of the type which is used in liquid state and cured may be suitably used.

Figure 8A:
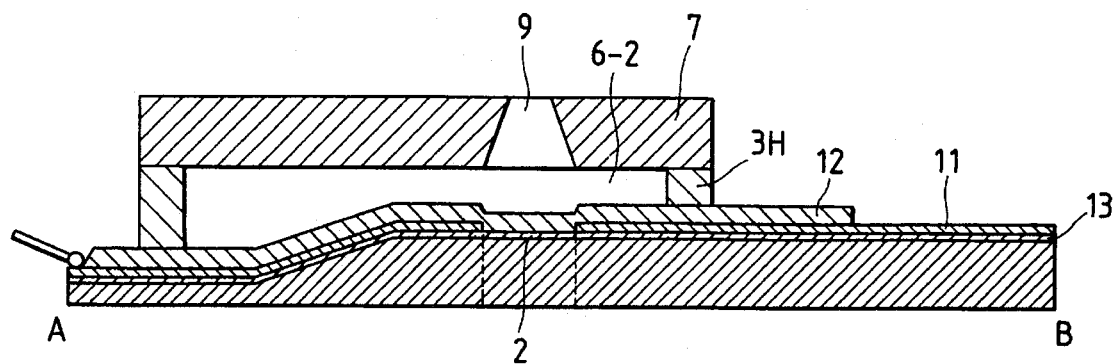
FIGS. 8A and 8B, and FIG. 9 are schematic diagrams showing another constitution of the recording head.
Figure 8B:
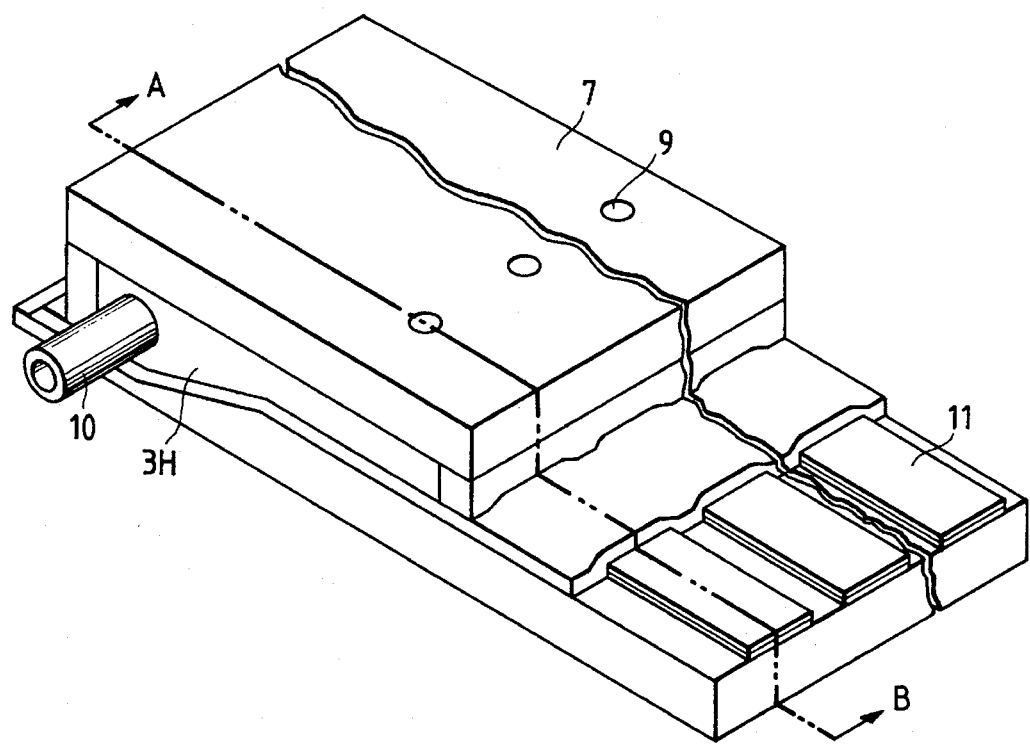
Figure 9:
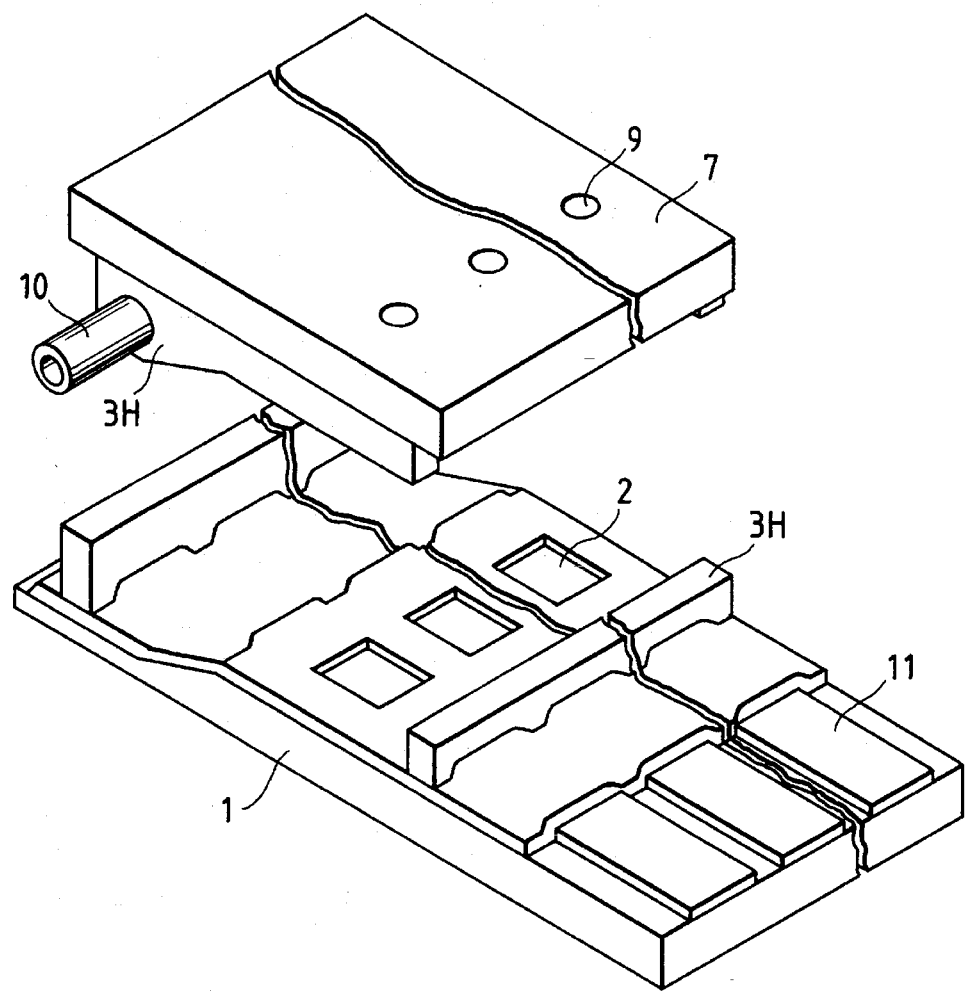
Figure 10A:
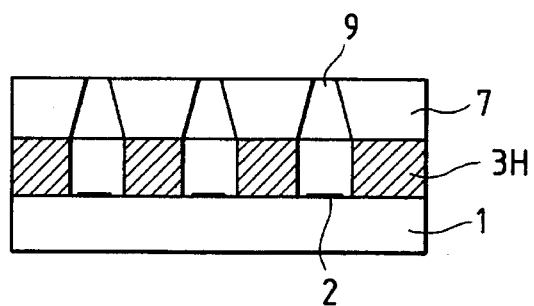
Figure 10B:
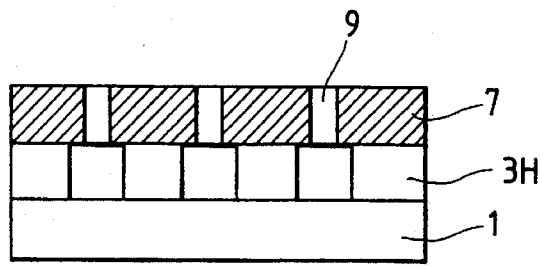

Further, the recording head of the present invention may be also one having a structure for discharging liquid in the direction vertical to the liquid path (6-2) shown in FIGS. 8A and 8B and FIG. 9, and in that case, for example, the cured film of the resin composition can be suitably utilized for the same portions as shown in FIG. 7, such as the portions in FIGS. 10A and 10B.

In the following, the active energy-ray-curing resin composition comprising the constituents (A) to (D) as mentioned above to be used in the constitution of the recording head of the present invention are described.

The resin composition, particularly when formed into a cured film, has excellent characteristics as a constituent member of a liquid jet recording head such that it has good adhesion to various members such as a substrate, etc. comprising glass, plastic, ceramics, etc., and is excellent also in resistance to the liquid for recording such as ink and mechanical strength, and yet can form a pattern which is precise and of high resolution by patterning with an active energy ray.

Further, the resin composition can be also used as the dry film, and also in that case the excellent characteristics as mentioned above can be exhibited.

For formation of the trunk chain of the graft copolymerized polymer (A) contained in said resin composition, the monomer component (a) as described above is used as the main component.

As the monomer to be used for the branched chain, in addition to the monomer component (b), polar monomers as described below are required to be used in combination, if necessary:
(I) acrylic monomers containing amino group or alkylamino group;
(II) acrylic or vinyl monomers containing carboxyl group;
(III) N-vinylpyrrolidone and its derivatives; and
(IV) vinylpyridine and its derivatives.

In addtion, it is possible to use a hydrophobic monomer as the component of the0copolymerization in an amount of about 25 mol % or less.

The above graft copolymerized polymer (A) can be prepared according to known methods, specifically by various methods as disclosed in "Base and Application of Polymer Alloy" p.10–35 (edited by Polymer Society of Japan, published by Tokyo Kogaku Dojin K.K., 1981). Examples of those methods include (1) the chain transfer method, (2) the method by use of radiation, (3) the oxidation polymerization method, (4) the ion graft polymerization method and (5) macromonomer method.

In accordance with any of these methods, the above graft copolymerized polymer (A) can be properly prepared using the foregoing monomers (a) and (b) under proper polymerization conditions which make it possible to obtain a desired graft copolymerized polymer having a number average molecular weight of 5,000 or more and a weight average molecular weight of 50,000 or less.

Among the above methods of (1) to (5'), the methods of (4) and (5) are preferred since the lengths of the graft chains may be easily uniformed. And, the macromonomer method of (5) is most preferred in view that it is advantageous in design of materials.

The foregoing linear polymer (B) may be properly prepared in accordance with the conventional polymerization method using the foregoing toohomer (c) as the main component and also using the foregoing monomer (b') under properly selected polymerization conditions which permit production of a linear polymer having a number average molecular weight of 50,000 or more and a weight average molecular weight of 350,000 or less and having a glass transition temperature of 60° C. or more.

In this case, it is preferred to add the monomer (b') in an amount of 5 to 30 mol % for the following reasons. That is, when more than 30 mol % of the monomer (b') is incorporated into a linear polymer to be obtained, there are disadvantages that the polar group content in a cured paint film will be undesirably heightened and because of this, any improvement cannot be attained in its adhesiveness with a substrate, and in addition to this, the resulting cured film will be such that is poor in the water proof. On the other hand, when less that 5 mol % of the monomer (b') is incorporated into a linear polymer to be obtained, not only the adhesiveness with substrate but also the effects of a paint film as the binder will be insufficient.

In order for the cured product of the resin composition to have a high glass transition temperature and to contribute in heightening the water proof among the foregoing monomer (c), methylmethacrylate, isobonylmethacrylate, isobonylacrylate, tricyclodecaneacrylate or tricyclodecanemethacrylate is most desired.

The foregoing epoxy resin (C) which contains at least one compound having one or more epoxy groups in one molecule is a component which permits the said resin composition to exhibit highly sensitive and satisfactory curability in the presence of the foregoing polymerization initiator (D) with the action of an active energy ray and in addition thereto, imparts better adhesiveness to a substrate, water resistance, resistance against chemicals, dimensional stability, etc., to the resulting cured film constituted of the said resin composition, when it is formed by applying the said resin composition in liquid state on a substrate of glass, plastics, ceramics, etc., followed by curing, or when it is used in the form of a dry film adhered onto a substrate.

There is not a particular limitation for the epoxy resin (C) as long as it is an epoxy resin that contains at least one kind of compound having one or more epoxy groups in one molecule.

However, in order for the resulting resin cured film from the resin composition to have desired resistance against chemicals, mechanical strength and high durability as a structural member, in order to improve the resolution of a pattern comprising the resin cured film to be formed on a substrate and also in order to improve the work efficiency at the time of forming various patterns comprising the resin cured film on a substrate, it is desired to use an epoxy resin containing at least one compound having two or more epoxy groups in one molecule.

Examples of such an epoxy resin containing two or more epoxy groups in one molecule include polyfunctional epoxy resins including epoxy resins as representd by bisphenol A type, novolac type and alicyclic type, or bisphenol S, bisphenol F, tetrahydroxyphenylmethane tetraglycidyl ether, resorcinol diglycidyl ether, glycerine triglycidyl ether, pentaerythritol triglycidyl ether, isocyanuric acid triglycidyl ether, epoxyurethane resins represented by the following formula I:

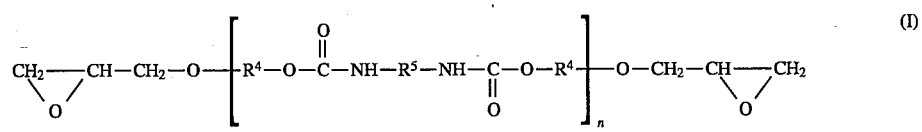

(wherein $R^4$ represents an alkyl group or an oxyalkyl group, $R^5$ represents

or an alkyl group) and the like, as well as mixtures of two or more of them.

Specific examples of these polyfunctional epoxy resins include those as mentioned in the following. That is, the bisphenol A type epoxy resins may include, for example, Epicoat 828, 834, 871, 1001 and 1004 (trade names, produced by Shell Chemical Co.), DER 331-J, 337-J, 661-J, 664-J and 667-J (produced by Dow Chemical Co.), Epicrone 800 (trade name, produced by Dainippon Ink Kagaku K.K.), etc. The novolac type epoxy resins may include, for example, Epicoat 152, 154 and 172 (trade names, produced by Shell Chemical Co.), Araldite EPN 1138 (trade name, produced by Ciba Geigy Co.), DER 431, 438 and 439 (trade names, produced by Dow Chemical Co.), etc. The alicyclic epoxy resins may include, for example, Araldite CY-175, -176, -179, -182, -184 and -192 (trade names, produced by Ciba Geigy Co.), Chissonox 090, 091, 092, 301 and 313 (trade names, produced by Chisso K.K.), CYRACURE 6100, 6110 and 6200 and ERL 4090, 4617, 2256 and 5411 (trade names, produced by Union Carbide Co.), etc. The polyglycidyl ethers of aliphatic polyhydric alcohol may include, for example, ethyleneglycol diglycidyl ether, polyethyleneglycol diglycidyl ether, propyleneglycol diglycidyl ether, polypropyleneglycol diglycidyl ether, neopentylglycol diglycidyl ether, 1,6-hexanediol diglycidyl ether, glycerine diglycidyl ether, trymethylolpropane triglycidyl ether, diglycidyl ether of hydrogenated bisphenol A, 2,2-dibromoneopentylglycol diglycidyl ether, etc. The polyglycidyl ethers derived from aromatic polyhydric alcohol may include, for example, diglycidyl ethers of an addition product of bisphenol A added with 2 to 16 mols of alkyleneoxide, diglycidyl ethers of an addition product of bisphenol F added with 2 to 16 mols of alkyleneoxide, diglycidyl ethers of an addition product of bisphenol S added with 2 to 16 mols of alkyleneoxide.

As the foregoing compound having an epoxy group in one molecule, there can be mentioned olefine oxides, octylene oxide, butyl, glycidyl ether, glycidyl methacrylate, acryl glycidyl ether, styrene oxide, phenyl glycidyl ether n-butylphenolglycidyl ether, 3-pentadecylphenyl glycidyl ether, cyclohexane vinyl monoxide, α-pinene oxide, glycidyl esters of tert-carboxylic acids, and mixtures of these compounds.

The monofunctional epoxy resins including the above compounds may be selectively used alone or in combination with the foregoing polyfunctional epoxy resins.

The foregoing polymerization initiator (D) capable of generating a Lewis acid with irradiation of an active energy ray to be used in the active energy-ray-curing resin composition in this invention is a component for curing the half-esterificated epoxy resin (C) as mentioned above with the action of the Lewis acid, which permits the said resin compositionto exhibit a high sensitivity and desired curability to an active energy ray. As such a polymerization initiator (D), there.may be preferably used, for example, aromatic onium salt compounds having photosensitivity containing an element belonging to the groups VIa as disclosed in Japanese Patent Publication No. 52-14278 or aromatic onium salt compounds having photosensitivity containing an element belonging to the group Va as shown in Japanese Patent publication No. 52-14279 or aromatic halonium salts having photosensitivity as shown in Japanese Patent publication No. 52-14277. These aromatic onium salt compounds or aromatic halonium salts all have the characteristic of curing the half-esterificated epoxy resin (C) by releasing a Lewis acid with irradiation of an active energy ray.

The aromatic onium salt compounds having photosensitivity of the element belonging to the group VIa or the group Va may include typically the compounds of the following formula II:

$$[(R^6)_a(R^7)_b(R^8)_cX]_d^+[MQ_e]^{-(e-f)} \qquad (II)$$

(where in $R^6$ is a monovalent organic aromatic group, $R^7$ is a monovalent organic aliphatic group selected from alkyl groups, cycloalkyl groups and substituted alkyl groups, $R^8$ is a polyvalent organic group for constituting heterocyclic or fused ring structure selected from aliphatic groups and aromatic groups, X is an element belonging to the group VIa selected from sulfur, selenium and tellurium or an element belonging to the group Va selected from nitrogen, phosphorus, arsenic, antimony and bismuth, M is a metal or metalloid and Q is halogen, a is an integer of 0 to 3 when X is an element belonging to the group VIa or an integer of 0 to 4 when X is an element belonging to the group Va, b is an integer of 0 to 2, c is an integer of 0 or 1 when X is an element belonging to the group VIa or an integer of 0 to 2 when X is an element belonging to the group Va, f is an integer of 2 to 7 representing the valence of M, e is an integer which is greater than f but not more than 8, and the sum of a, b and c is 3 when X is an element belonging to the group VIa or 4 when X is an element belonging to the group Va, and d=e–f ).

On the other hand, the photosensitive aromatic halonium salt may be exemplified by the following formula III:

$$[(R^9)_g(R^{10})_hX]_i^+[MQ_j]^{-(k-1)} \qquad (III)$$

(wherein $R^9$ is a monovalent aromatic organic group, $R^{10}$ is a divalent aromatic organic group, X is halogen, M is a metal or metalloid and Q is halogen, respectively, g is an integer of 0 or 2 and h is an integer of 0 or 1, with the sum of g and h being equal to 2 or the valence of X, i being equal to k–1, j is an integer of 2 to 7 which is equal to the valence of M, and k is an integer greater than one but up to 8).

Specific examples of the photosensitive aromatic onium salt compounds containing an element belonging to the group VIa or the group Va may include the photosensitive aromatic onium salts of the elements belonging to the group VIa as shown below:

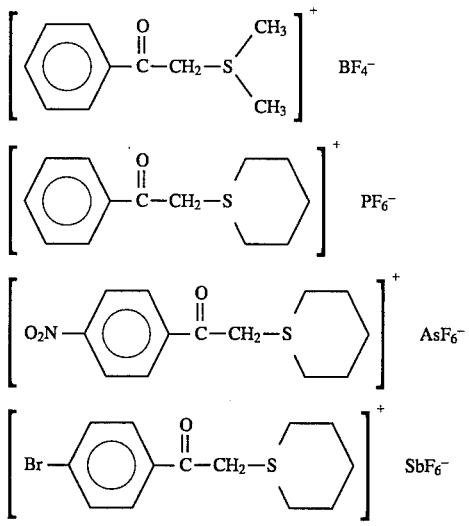

-continued
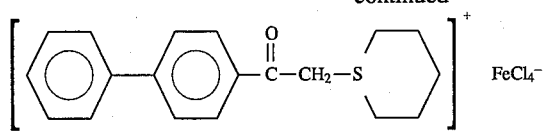 FeCl$_4^-$ e)
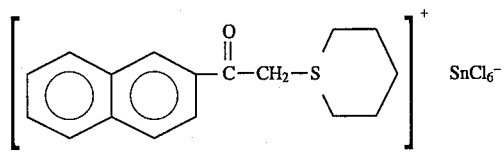 SnCl$_6^-$ f)
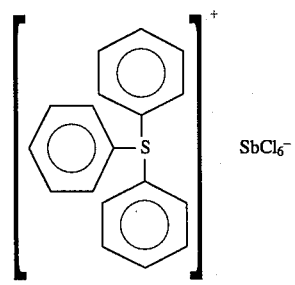 SbCl$_6^-$ g)
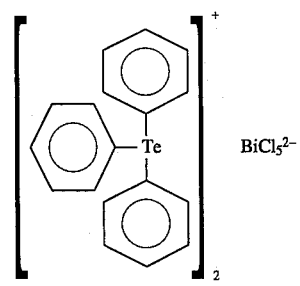 BiCl$_5^{2-}$ h)
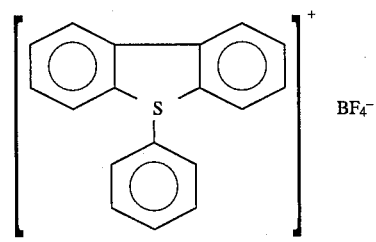 BF$_4^-$ i)
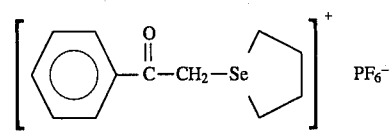 PF$_6^-$ j)
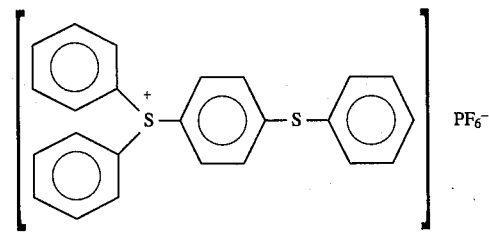 PF$_6^-$ k)
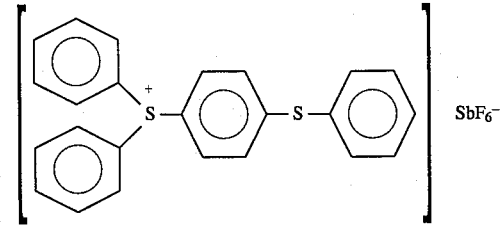 SbF$_6^-$ l)

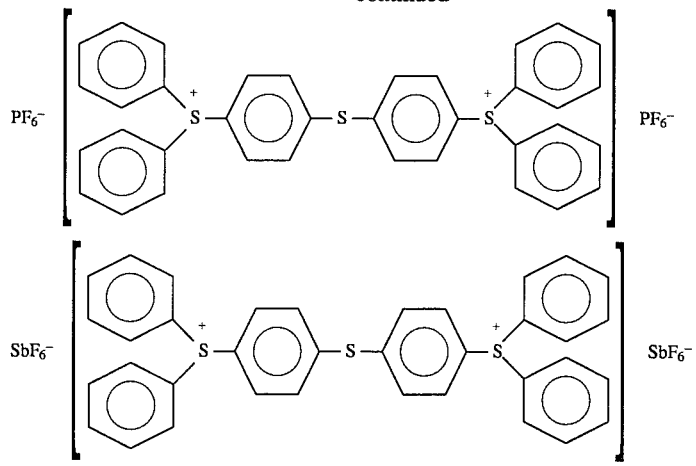
and photosensitive aromatic onium salts of the elements belonging to the group Va as shown below:
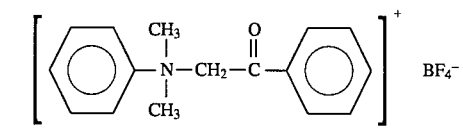  1)
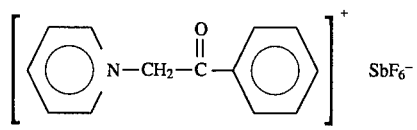  2)
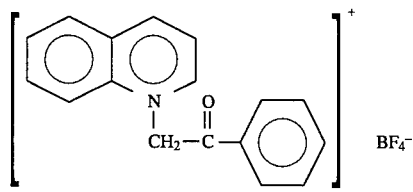  3)
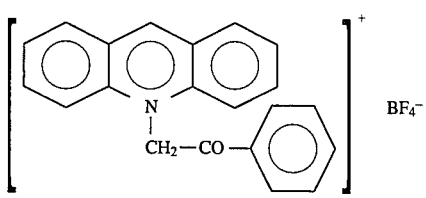  4)
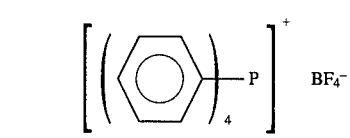  5)
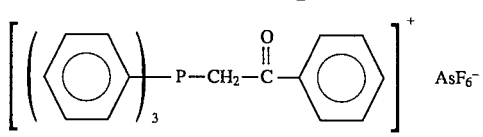  6)
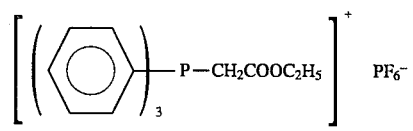  7)
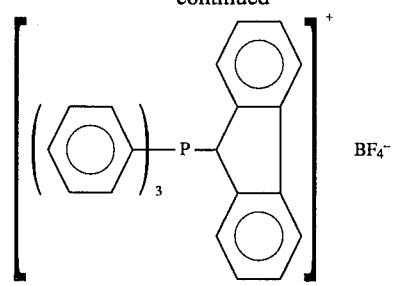  8)
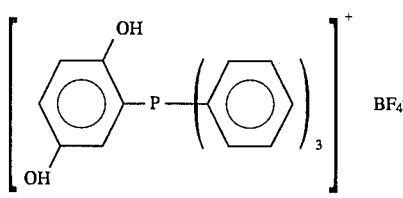  9)
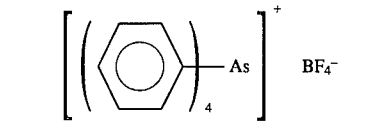  10)
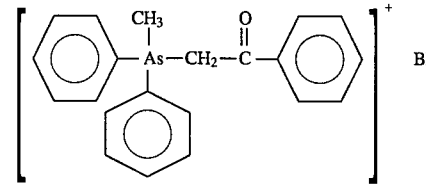  11)
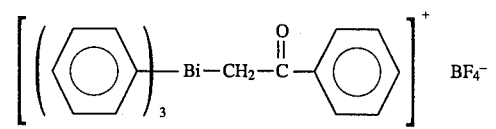  12)
Specific examples of the photosensitive aromatic halonium salts include, for example:
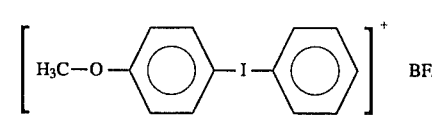  A)

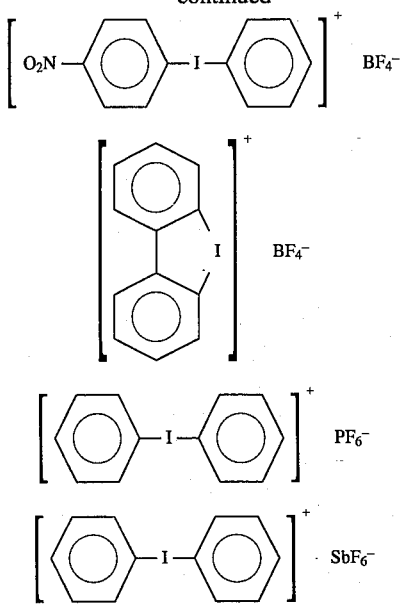

In addition to the above polymerization initiator (D) generating a Lewis acid, it is possible to use a proper known hardner selected from polyamines, polyamides, acid anhydrides, boron trifluorideamine complexes, imidazoles, complexes of imidazoles with metal salts, in case where necessary.

The active energy-ray-curing resin composition to be used for manufacturing a liquid jet recording head according to this invention is one that is cured with irradiation of an active energy ray. In the case where there are used a graft copolymerized polymer (A) and/or a linear polymer (B) respectively having photopolymerizability and an active energy ray with a wavelength of 250 nm to 450 nm, it is desired to place a radical polymerization initiator having the properties of being activated with the action of an active energy ray, forming organic free radicals and initiating radical polymerization in the said res in composition.

Specific examples of such radical polymerization initiators include benzyl ether: benzoin alkyl ethers such as benzoin isobutyl ether, benzoin isopropyl ether, benzoin-n-butyl ether, benzoin. ethyl ether, benzoin methyl ether and the like; benzophenones such as benzophenone, 4,4'-bis (N,N-diethylamino) benzophenone benzophenone methyl ether and the like; anthraquinones such as 2-ethylanthraquinone, 2-tert-butylanthraquinone and the like; xanthones such as 2,4-dimethylthioxanthone, 2,4-diisopropylthioxathone and the like; acetophenones such as 2,2-dimethoxy-2-phenylacetophenone, α, α-dichloro-4-phenoxyacetophenone, p-tert-butyltrichloroacetophenone, p-tert-butyldichloroacetophenone, 2,2-diethoxyacetophenone, p-dimethylaminoacetophenone and the like; or hydroxycyclohexylphenyl ketone (e.g., Irugacure 184, produced by Ciba Geigy Co.), 1-(4-isopropylphenyl)-2-hydroxy-2-methylpropane-1-on (e.g. Darocure 1116, produced by Merck Co.): 2-hydroxy-2-methyl-1-phenylpropane-1-on (e.g. Darocure 1173, produced by Merck Co.): etc., as preferable ones.

In addition to these radical polymerization initiators, amino compounds may be added as the photopolymerization accelerator.

The amino compounds to be used as the photopolymerization accelerator may include ethanolamine, ethyl-4-dimethylaminobenzoate, 2-(dimethylamino) ethylbenzoate, p-dimethylaminobenzoic acid n-amylester, p-dimethylaminobenzoic acid isoamyl ester, etc.

Next, the formulation ratio of the respective components as described above may be suitably selected depending on the use site or the use purpose of the active energy-ray-curing resin composition containing these components in the liquid jet recording head of the present invention.

For example, in a preferred embodiment, the weight ratio of the graft copolymerized polymer A to the linear polymer (B) is desired to be such that (A): (B) is in the range of from 80:20 to 50:50 in parts by weight.

This situation is an important factor for the active energy-ray-curing resin composition according to this invention to exhibit a desired adhesiveness to a substrate based on the graft copolymerized polymer (A) and a desired patterning property based on the linear polymer (B).

The weight ratio of the sum amount of the graft copolymerized polymer (A) and the linear polymer (B) to the epoxy resin (C) is desired to be such that [(A)+(B)]:(C) is in the range of from 100:50 to 100:200 in parts by weight.

Further, the weight ratio of the sum amount of the graft copolymerized polymer (A), the linear polymer (B) and the epoxy resin (C) to the photoinitiator (D) is desired to be such that [(A)+(B)+(C)]:(D) is in the range of from 100:1 to 100:10 in parts by weight.

In the case where the foregoing radical polymerization initiator (E) and/or the foregoing photopolymerization accelerator (F) is used in addition to the polymerization initiator, the weight ratio of the sum amount of the above (A), (B), (C) and (D) to the above (E) or (F) or the sum amount of (E) and (F) is desired to be such that [(A)+(B)+(C)+(D)]:(E) or (F) or [(E)+(F)] is in the range of from 100:1 to 100:10 in parts by weight.

Further, in the active energy-ray curing resin composition, if necessary, there may be also added condensation crosslinking catalysts, thermal polymerization inhibitors, colorants such as dyes, pigments, etc., thermal stabilizers such as hydroquinone, p-methoxyphenol, etc., close contact accelerators, plasticizers, extender pigments such as silica, talc, etc., leveling agents which give coating adaptability and so on.

For example, as the condensation crosslinking catalyst, sulfonic acids as represented by p-toluenesulfonic acid, carboxylic acids such as formic acid, etc. may be included. As the thermal polymerization inhibitor, hydroquinone and derivatives thereof, p-methoxyphenol, phenothiazine, etc. may be included. As the colorant, oil-soluble dyes and pigments can be added within the range which does not substantially interfere with transmission of the active energy ray. As the filler, for hardness elevation of the coating, elevation of coloration, close contact, mechanical strength, extender pigments, plastic fine particles, etc. used in coating materials in general may be employed. As the close contact accelerator, there are silane coupling agents as the inorganic surface modifier, low molecular weigh surfactant, etc.

As the solvent to be used when using the above active energy-ray-curing resin composition in a solution, or coating the resin composition on a plastic film and the like which is a film substrate in forming a dry film for penetration of the liquid jet recording head of the present invention, hydrophilic solvents such as alcohols, glycol ethers, glycol esters, etc. may be included. Of course, it is also possible to use mixtures based primarily on these hydrophilic solvents, optionally mixed suitably with ketones such as methyl ethyl ketone, methyl isobutyl ketone, etc.; esters such as ethyl acetate, isobutyl acetate, etc.; aromatic hydrocarbons such as toluene, xylene, etc. and halogen derivatives thereof; aliphatic solvents containing chlorine such as methylene chloride, 1,1,1-trichloroethane, etc. These solvents can be also used as the developer of said resin composition.

In preparing the liquid jet recording head of the present invention, the resin composition can be formed into a cured layer on a substrate and the like according to conventional methods.

For example, the following cases may be included.

(1) The case when a layer comprising a cured coating film is formed on a substrate, etc.;

The above-mentioned active energy-ray-curing resin composition in liquid state is imparted onto a substrate, etc. for forming a liquid coating film, and then dried by evaporation. And, the dried coating film obtained is cured by irradiation of an active energy ray to make a layer comprising a cured coating film.

(2) The case when a layer comprising a cured coating film in shape of a desired pattern is formed on a substrate, etc. (First one);

The above-mentioned active energy-ray-curing resin composition in liquid state is imparted onto a substrate, etc. for forming a liquid coating film, and then dried by evaporation. And, a laser beam is scanned to a desired pattern on the layer comprising the dried coating film, and a cured coating film layer with a desired pattern shape is formed on the substrate, etc. by removing the unexposed portion with an appropriate solvent such as 1,1,1-trichloroethane, etc.

(3) The case when a layer comprising a cured coating film with a desired pattern shape is formed on a substrate, etc (Second one);

Onto a substrate, etc., the above-mentioned active energy-ray-curing resin composition in liquid state is imparted for forming a liquid coating film, and subsequently dried by evaporation. On the layer comprising the dried coating film obtained, a photomask having a desired pattern through which the active energy ray is not transmitted is superposed, and exposure is effected from above the photomask with the active energy ray. And, the unexposed portion is removed with an appropriate solvent such as 1,1,1-trichloroethane, etc. to form a layer comprising a cured coating film with a desired pattern shape on the substrate, etc.

(4) The case when a photosensitive dry film is formed, and the dry film is laminated on a substrate, etc.;

The above-mentioned active energy-ray-curing resin in liquid state is imparted onto..a polyethylene terephthalate film for formation of a liquid film, and subsequently dried by evaporation to obtain a photosensitive dry film on the polyethylene terephthalate film. The dry film is laminated on a substrate, etc. by conventional lamination method for obtaining a laminate. And, the photosensitive dry film laminated on the substrate, etc. is cured by irradiation with the active energy ray according to the same method as the above-described method (1). When the cured photosensitive film is to be formed into a desired pattern, the above dry film laminated on the support is treated according to the same methods as (2) or (3) as described above.

When the active energy-ray-curing resin composition contains a monomer represented by the above general formula (x), it is desirable to further effect condensation curing of the cured film obtained by the methods (1) to (4) as described above by subjecting it to heating treatment at a temperature of 80° C. to 200° C.

In the preparation process of the liquid jet recording head of the present invention, as the active energy ray to be used for curing the active energy-ray-curing resin composition, or pattern exposure onto the resin composition, etc., UV-ray or electron beam already practically applied widely may be employed. As the UV-ray light source, high pressure mercury lamps, ultra-high pressure mercury lamps, metal halide lamps, etc. enriched in light with wavelengths of 250 nm to 450 nm may be included, and one with a light intensity in the vicinity of 365 nm of about 1 mW/cm$^2$ to 100 mW/cm$^2$ at a practically tolerable distance between the lamp and the material to be irradiated may be preferred. The electron beam irradiation apparatus is not particularly limited, but an apparatus having a dose within the range from 0.5 to 20M Rad is practically suitable.

Referring now to the case of forming the liquid path wall 3H with a cured film of the dry film type obtained from the above-mentioned resin composition as an example, the method for preparing the liquid jet recording head is to be described.

FIG. 2 to FIG. 6B are schematic diagrams for illustration of the preparation procedure of the liquid jet recording head of the present invention.

Figure 2:
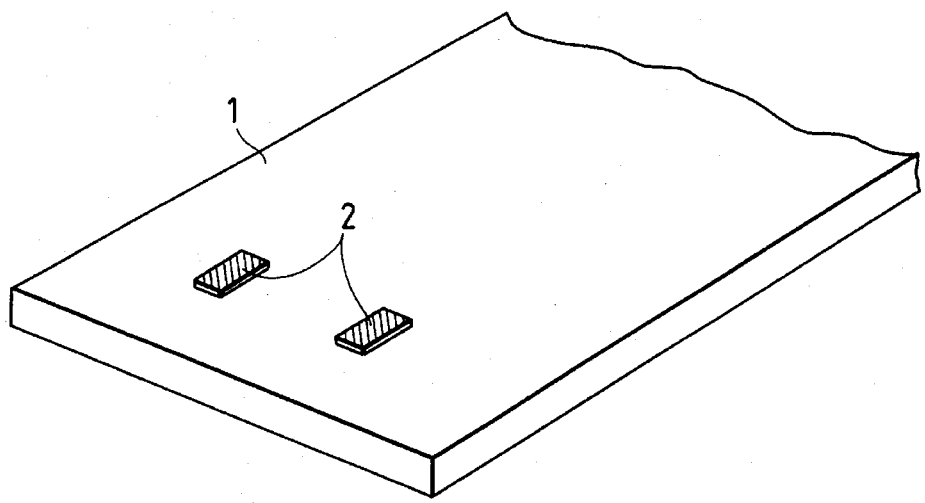

For formation of the liquid jet recording head of the present invention, as shown in FIG. 2, discharge energy generating devices 2 such as heat generating element, piezoelectric elements, etc. are arranged in a desired number on the substrate 1 of glass, ceramic, plastic or metal, etc. If necessary, for imparting resistance to the liquid for recording, electrical insulation, etc. to the surface of the substrate, said surface may be coated with a protective layer of $SiO_2$, $Ta_2O_5$, glass, etc. To the discharge energy generating elements 2 are connected electrodes for inputting recording signals, although not shown.

Figure 3A:
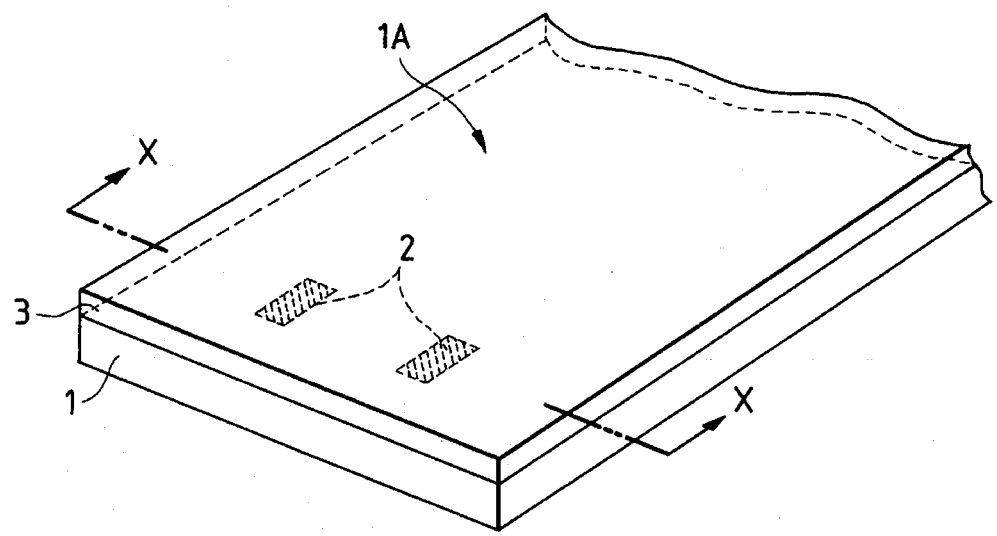
Figure 3B:
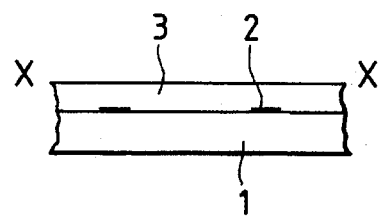

Next, after cleaning and drying at, for example, 80° to 150° C. of the surface of the substrate 1 obtained via the step shown in FIG. 2, as shown in FIG. 3A and FIG. 3B, the above-described active energy-ray-curing resin composition 3 of the dry film type (film thickness: about 20 μm to 200 μm) is heated to about 40° to 130° C., and laminated on the substrate surface 1A under the conditions of, for example, a speed of 0.5 to 0.4 f/min. and pressurization of 1 to 3 Kg/cm$^2$.

Figure 4:
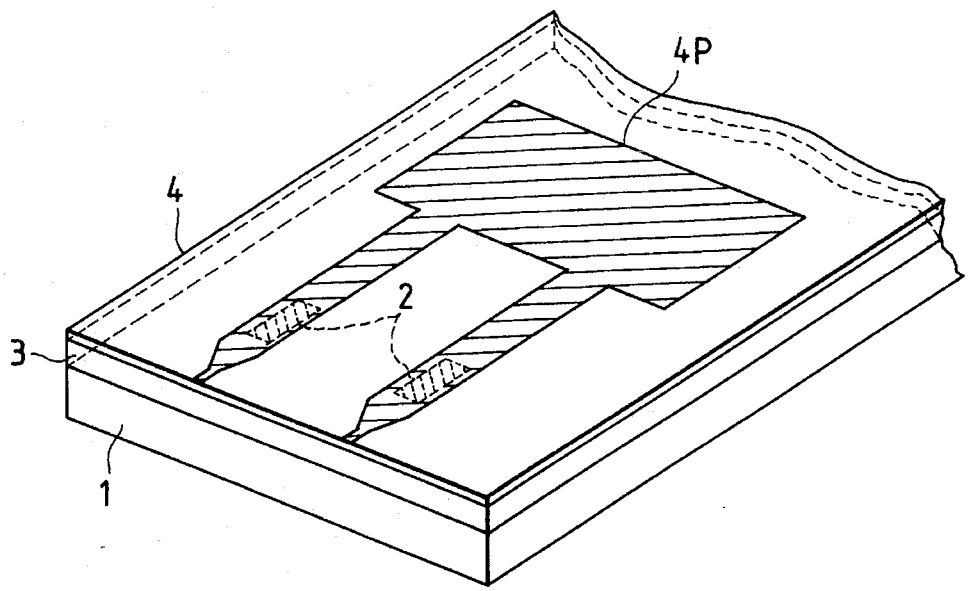

Subsequently, as shown in FIG. 4, after a photomask 4 having a pattern 4P with a predetermined shape which does not transmit the active energy ray is superposed on the dry film layer 3 provided on the substrate surface 1A, exposure is effected from above the photomask 4.

Alignment between the photomask 4 and the substrate 1 is effected so that the above elements 2 may be positioned in the liquid path regions formed finally via the steps of exposure, developing processing, etc., and can be practiced according to the method in which alignment marks are drawn respectively on the substrate 1 and the mask 4, and alignment is effected following the marks.

By carrying out thus exposure, the portions other than the region covered with the above-mentioned pattern, namely the portion of the dry film layer 3 exposed is cured by polymerization to become solvent insoluble, while the portion not exposed remains solvent soluble.

As the active energy ray to be used for this pattern exposure, suitable one may be selected and used from among active energy rays known in the art depending on the kinds of the components of the abovedescribed active energy ray curing resin composition, including specifically, for example, high pressure mercury lamp, ultra-high pressure mercury lamp, metal halide lamp, carbon arc lamp, electron beam, etc.

For example, as the UV-ray light source, high pressure mercury lamp, ultra-high pressure mercury lamp, metal halide lamp, etc. enriched in light with wavelengths of 250 nm to 450 nm may be included, and one with a light intensity in the vicinity of 365 nm of about 1 mW/cm$^2$ to 100 mW/cm$^2$ at a practically tolerable distance between the lamp and the object to be irradiated may be preferred. The electron beam irradiation apparatus is not particularly limited, but an apparatus having a dose within the range from 0.5 to 20M Rad is practically suitable.

Figure 5A:
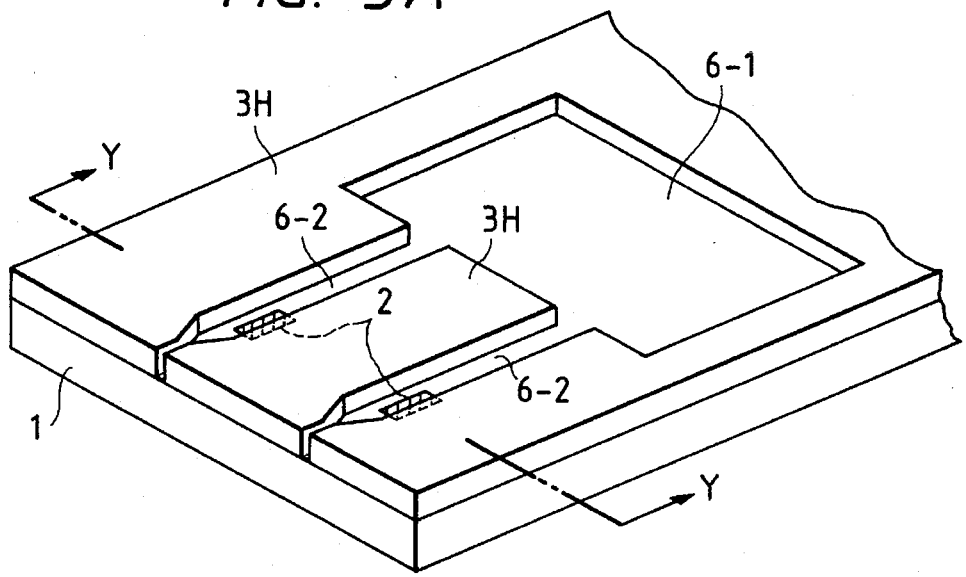
Figure 5B:
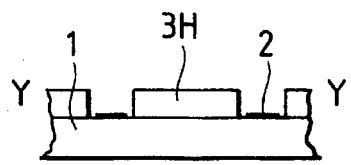

On completion of the pattern exposure of the dry film layer 3, next the exposed dry film 3 is subjected to developing processing by dipping into a volatile organic solvent such as 1,1,1-trichloroethane, etc., thereby dissolving away the unpolymerized (uncured) portion of the dry film layer 3 on the substrate 1 which is solvent soluble to form the groove which becomes finally the liquid paths 6-2 and the liquid chamber 6-1 with the resin cured film 3H remaining on the substrate 1, as shown in FIGS. 5A and 5B.

Next, the cured resin film 3H on the substrate 1 is heated at a temperature of at least 80° C. for about 10 minutes to 3 hours to carry out thermal polymerization. When a thermoserring graft copolymerized polymer is used in the resin composition 3, the heating treatment is made a temperature of at least 100° C. for about 5 to 60 minutes.

In the recording head of this example, description is made about an example by use of a resin composition of the dry film type, namely in solid state, for formation of the groove which becomes the liquid path 6-2 and the liquid chamber 6-1, but the active energy-ray-curing resin composition which can be used in formation of the recording head of the present invention is not only limited solid state, but of course liquid ones can be used.

As the method for forming a layer comprising a liquid resin composition by use of the composition on the substrate, for example, there may be employed the method by means of squeezy used during preparation of a relief image, namely in which a wall of a height corresponding to the thickness of a coating of a desired composition is provided around the substrate, and superfluous resin composition is removed by a squeezy. In this case, the viscosity of the resin composition may be appropriately 100 cp to 3000 cp. The height of the wall placed around the substrate is required to be determined by taking into account the reduction of the solvents contained in the photosensitive resin composition by evaporation.

When a solid resin composition is used, the method of plastering a dry film onto a substrate by heating pressure contact as described above is suitable.

However, in forming the recording head of the present invention, the solid film type is convenient in handling, or with respect to easy and accurate control of the thickness.

Figure 6A:
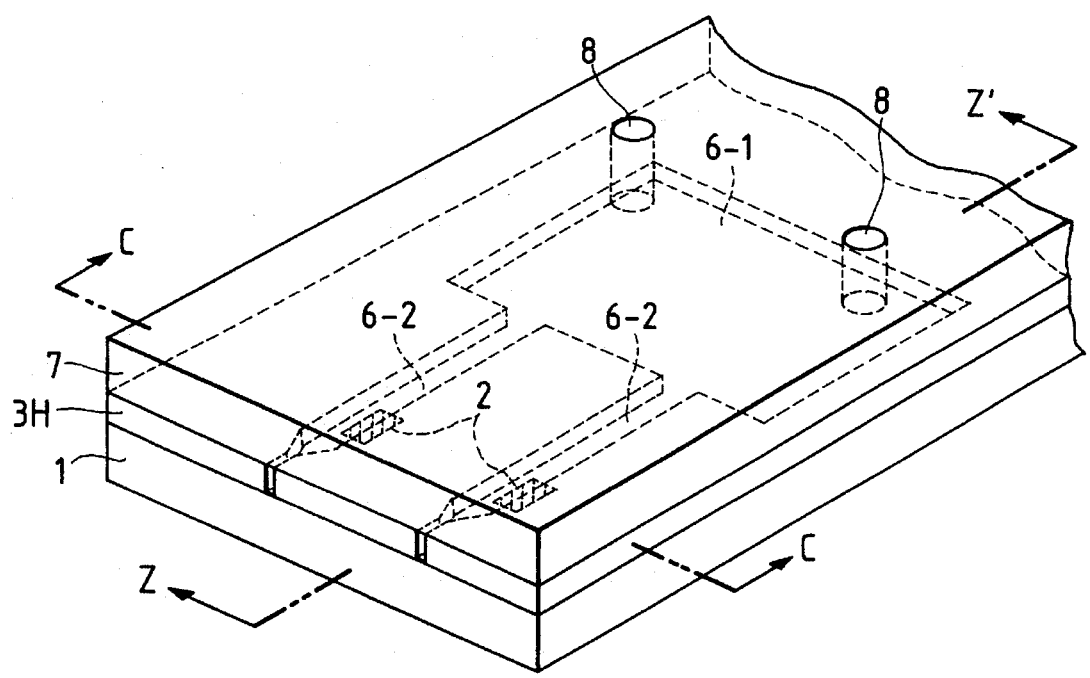
Figure 6B:
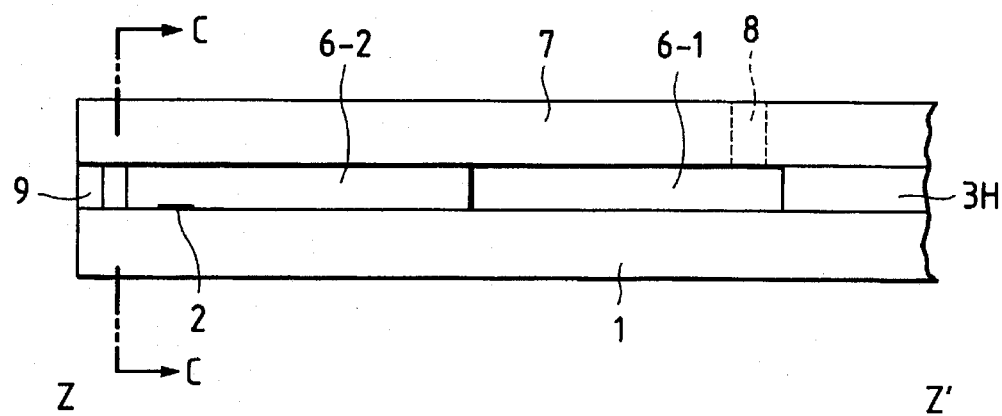

After having thus formed the groove constituting finally the liquid path 6-2 and the liquid chamber 6-1 with the resin cured film 3H, a flat plate 7 which becomes the cover of the groove is bonded to the resin cured film 3H with an adhesive to form a bonded product, as shown in FIGS. 6A and In the step shown in FIGS. 6A and 6B, as a specific method for providing the cover 7, there is, for example, the method in which the flat plate 7 of glass, ceramic, metal, plastic, etc. is spin coated with an epoxy type adhesive to a thickness of 3 to 4 μm, then preheated to effect the so called B-staging and plastering this onto the cured dry film 3H, followed by main curing of the above-mentioned adhesive layer, etc. However, there may be also employed the method not using an adhesive in which the flat plate 7 of a thermoplastic resin such as acrylic resin, ABS resin, polyethylene, etc. is directly thermally fused onto the resin cured film 3H.

Also, it is preferable to use the method in which a resin layer comprising the resin composition for formation of a resin cured film in the present invention is provided on the side to be bonded to the liquid path of the cover 7 thermally, fused with the resin cured film 3H having the liquid paths formed, and then heated by irradiation of an active energy ray. That is, this is the method in which the resin composition for formation of a resin cured film in the present invention is used as an adhesive.

In FIGS. 6A and 6B, 6-1 shows the liquid chamber, 6-2 the liquid paths, 8 the thru-hole for connecting the feeding pipe (not shown) for feeding the liquid for recording into the liquid chamber from the outside of the recording head to the inside.

Thus, after completion of bonding of the resin cured film 3H provided on the substrate 1 with the flat plate 7, the bonded product is cut along C—C corresponding to the downstream side of the liquid path 6-2 shown in FIGS. 6A and 6B to form orifices for discharging the liquid for recording which are openings of the liquid paths at the cut surface.

This step is done for optimizing the interval between the discharge energy generating device 2 and the orifice 9, and here the region to be cut may be suitably selected. In carrying out this cutting, the dicing method, etc. conventionally employed in semiconductor industries can be employed.

The downstream portion of the liquid path as mentioned in the present invention refers to the downstream region in the flow direction of the liquid for recording when recording is performed by use of a recording head, specifically the portion of the liquid path downstream of the position where the discharge energy generating device 2 is provided.

When cutting is completed, the cut surface is polished to be smoothened, and the feeding pipes (not shown) are mounted on the thru-hole 8 to complete the liquid jet recording head as shown in FIGS. 1A and 1B.

In the example as described above, after formation of the resin cured film 3H on the substrate 1, the cover 7 is bonded thereto, but it is also possible to form the resin cured film 3H on the side of the cover 7 and then bond it to the substrate 1. Also, the liquid paths 6-2 and the liquid chamber 6-1 may be separately formed.

A preferred example of a recording apparatus employing the recording head in accordance with the present invention is described by referring to the drawing.

Figure 11:
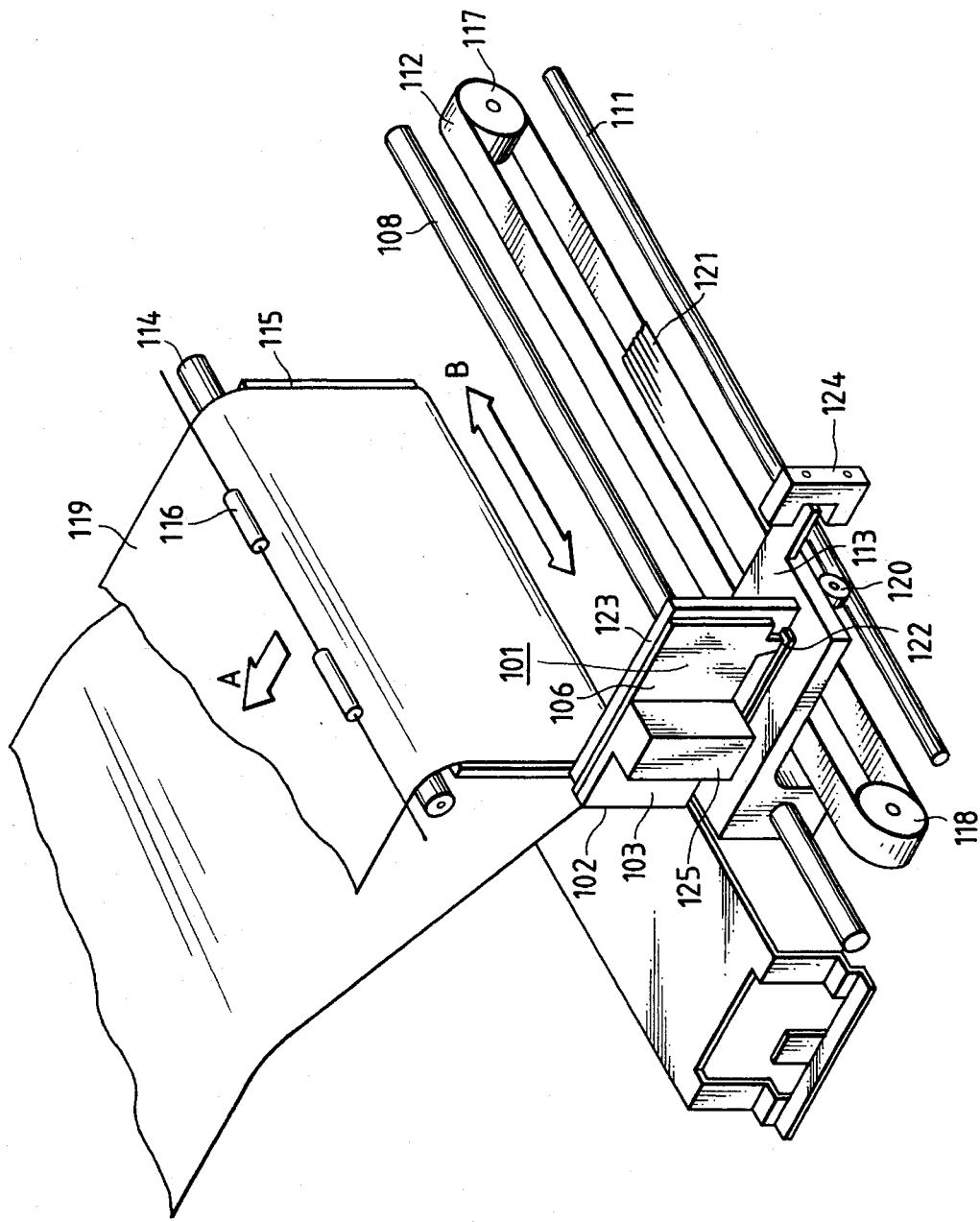
FIG. 11 is a schematic perspective view showing an example of the recording apparatus of the present invention.

FIG. 11 is a perspective view schematically showing an embodiment of the liquid ejection recording apparatus of the present invention. In FIG. 11, reference numeral 119 designates recording paper. The recording paper 119 is moved on a platen 115 at a predetermined speed in the subsidiary scanning direction (the direction of arrow A) by a paper feeding roller 114 and a pinch roller 116. Reference numeral 117 and 118 denote pulleys supported on respective shafts and rotated by a drive source (not shown). A carriage driving belt 112 is passed over the pulleys 117 and 118.

A carriage 113 is integrally fixed to the carriage driving belt 112. The carriage 113 is guided by guide shafts 108 and 111 and is reciprocally movable in the major scanning directions (the directions of arrow B) by the rotation of the pulleys 117 and 118 a roller 120 adapted to roll on the guide shaft 111 is disposed on the underside of the carriage 113.

A connector 122 electrically connected to flexible wiring 121 is disposed substantially in the central portion of the carriage 113, and a head aligner 123 or aligning the liquid ejection recording head (hereinafter referred to as the recording head) 101 when the wires of the recording head 101 are connected and fixed to the connector 122 is vertically provided on the carriage 113. Accordingly, the recording head 101 is removable from the carriage 113 by the connector 122. Also, a sensor 124 for detecting the home position of the carriage 113 is provided.

The recording head 101 has a substrate 106, which in turn has thereon discharge ports 102 for discharging ink droplets which are flying droplets, a liquid flow path constituting portion 103 for constituting liquid flow paths communicating with the discharge ports 102 and having energy generating members such as heat generating elements for forming flying ink droplets, and an ink chamber for storing therein ink to be supplied to the liquid flow paths. To the energy generating members of the recording head 101, a driving voltage is supplied from a driving voltage generating circuit 129 (not shown) through the connector 122 and the flexible wiring 121 and also, a discharge control signal for controlling the discharge of ink droplets from the discharge ports 102.

The present invention is described in more detail by referring to Synthesis Examples and Examples. However, the present invention is not limited to the following Examples at all.

Synthesis Example 1

1. Provision of each of the components (A) to (D) for the preparation of an active energy-ray-curing resin composition of this invention.

Preparation of a graft copolymerized polyer (A)

Radical chain transfer polymerization of 80 parts by weight of 2-hydroxyethylmethacrylate and 20 parts by weight of butylacrylate was carried out using thioglycolic acid as the chain transferring agent and azobisisobutyronitrile as the polymerization initiator to obtain an oligomer having a carboxyl group at the terminal end of the molecular chain.

This oligomer was reacted with glycidylmethacrylate to obtain a macromonomer having a methacryloyl group at one terminal end of the molecular chain. The result of the measurement by the known GPC method gave a value of about 3,000 for the number average molecular weight of the resultant macromonomer.

Solution polymerization of 30 parts by weight of the said macromonomer and 70 parts by weight of methylmethacrylate was carried out in methyl cellosolve solvent to thereby obtain a graft copolymerized polymer having a weight average molecular weight of about 40,000 and a number average molecular weight of about 5,500.

A linear polymer (B)

There was provided a linear acrylic polymer obtained by polymerizing methylmethacrylate. This linear acrylic polymer is one that has a number average molecular weight of about 70,000 and a weight average molecular weight of about 250,000.

A epoxy resin (C)

There were provided the following three kinds of epoxy resins 1) to 3):

1): Epicoat 1001 (trade name, produced by Yuka Shellepoxy K.K.)(epoxy resin of bisphenol A type: epoxy equivalent of 450–500)

2): Epicoat 152 (trade name, produced by Yuka Shellepoxy K.K.)(epoxy resin of cresol novolak type: epoxy equivalent of 172–179)

3): Celloxide 2021 (trade name, produced by Daiseru Kagaku K.K.)(epoxy resin of alicyclic type: epoxy equivalent of 128–145)

A polymerization initiator (D)

There was provided bis-[4-(diphenylsulfonio)phenyl]-sulfide-bis-hexafluoroantimonate represented by the foregoing formula n).

2. Preparation of an active energy ray-curing resin composition of this invention.

The above components (A) to (D) were well mixed by the weight ratios as below shown in accordance with the conventional mixing technique to thereby obtain the active energy-ray-curing resin composition, in which there were used the additives as below shown.

| Component | Parts by weight |
|---|---|
| (A) | 50 |
| (B) | 50 |
| (C)-1 | 50 |
| (C)-2 | 20 |
| (C)-3 | 30 |
| (D) | 10 |
| toluene | 100 |
| methyl cellosolve | 200 |

Synthesis Example 2

1. Provision of each of the components (A) to (D) for the preparation of an active energy-ray-curing resin composition of this invention

Preparation of a graft copolymerized polymer (A)

The procedures for the preparation of the macromonomer in Synthesis Example 1 were repeated, except that there were used 50 parts by weight of 2-hydroxyethylmethacrylate and 50 parts by weight of butoxymethylacrylamide, to thereby obtain a macromonomer having a methacryloyl group at one terminal end of the molecular chain.

The result of the measurement by the known GPC method gave a value of about 2,000 for the number average molecular weight of the resultant macromonomer.

Solution polymerization of 20 parts by weight of the said macromonomer and 80 parts by weight of methylmethacrylate was carried out in a solvent containing methyl cellosolve and methylethy ketone in the weight ratio of 60:40 to thereby obtain a thermosetting graft copolymerized polymer having a number average molecular weight of about 5,000 and a weight average molecular weight of about 30,000.

A linear polymer (B)

There was provided a linear acrylic copolymer obtained by polymerizing methylmethacrylate and tricyclodecanmethacrylate in the molar ratio of 70:30. This linear weight of about 60,000 and a weight average molecular weight acrylic copolymer is one that has a number average molecular of about 260,000.

A epoxy resin (C)

There were provided the following two kinds of epoxy resins (C)-(1) and (C)-(2):

(C)-(1): Epicoat 828 (trade name, produced by Yuka Shellepoxy K.K.)(epoxy resin of bisphenol A type: epoxy equivalent of 183–193)

(C)-(2): Celloxide 2021 (trade name, produced by Daiseru Kagaku K.K.) (epoxy resin of alicyclic type: epoxy equivalent of 128–145)

A. polymerization initiator (D)

There was provided an aromatic onium salt represented by the foregoing formula n).

2. Preparation of an active energy-ray-curing resin composition of this invention.

The above components (A) to (D) were well mixed by the weight ratios as below shown in accordance with the conventional mixing technique to thereby obtain the active energy-ray-curing resin composition, in which there were used the additives as below shown.

| Component | Parts by weight |
| --- | --- |
| (A) | 70 |
| (B) | 30 |
| (C)-(1) | 120 |
| (C)-(2) | 40 |
| (D) | 12 |
| toluene | 100 |
| methyl cellosolve | 200 |

Example 1

By use of the liquid active energy-ray-curing resin composition obtained in Synthesis Example 1, following the steps in FIG. 1A to FIG. 6B as described above, preparation of an on-demand type liquid jet recording head of the type shown in FIG. 7F having 10 heat-generating elements [hafnium boride ($HfB_2$)] and orifices provided corresponding to the heat-generating elements (orifice dimensions: 80 μm×50 μm, arrangement pitch 0.130 mm) was practiced as described below. The recording heads of the same shape were trially made each in number of 30.

First, a plurality of the heat-generating elements were arranged at predetermined positions on a substrate comprising silicon, and electrodes for application of recording signals were connected to these.

Next, a $SiO_2$ layer (thickness 1.0 μm) as the protective layer was provided on the substrate surface having heat-generating elements arranged thereon, and after the surface of the protective layer was cleaned and dried, the liquid active energy-ray-curing resin composition obtained in Synthesis Example 1 was coated on the protective layer by use of a roll coater, and the coating film layer obtained was dried in hot air at 100° C. for 15 minutes to obtain a dried coating film layer with a thickness of about 50 μm.

Next, with a photomask having a pattern corresponding to the liquid paths and the liquid chamber superposed on the dried coating film layer, alignment was performed so that the above elements could be provided in the liquid path to be finally formed followed by vacuum adhesion, and then exposure was effected from above the photomask under a high pressure mercury lamp with the maximum irradiation energy of 100 mW/cm$^2$ for 60 seconds.

After completion of irradiation, the dried coating film layer was subjected to spray developing processing with of Eterner NU at 35° C. for 60 seconds, thereby dissolving away the unpolymerized (uncured) portion of the dried coating film layer to form a groove which becomes finally the liquid paths and the liquid chamber with the wall comprising the cured coating film remaining on the substrate.

After completion of developing processing, post-exposure was effected on the cured coating film on the substrate with a UV-ray of 10 J/cm$^2$ and further heating treatment was performed at 150° C. for 30 minutes.

Thus, after formation of the groove which becomes the liquid paths and the liquid chamber with the wall comprising the cured coating film, a flat plate (ceiling plate) provided with thru-holes comprising soda glass which becomes the cover of the groove formed was coated with the liquid active energy ray-curing resin composition obtained in Synthesis Example 1, and the coating film layer obtained was dried in hot air at 80° C. for 5 minutes to obtain a dried coating film layer with a thickness of 3 μm.

Next, the ceiling plate was bonded with alignment under pressurization to the wall comprising the cured coating film on the substrate previously obtained on the dried coating layer side, followed further by irradiation of a UV-ray of 50 mW/cm$^2$, 60 seconds on the dried coating film layer from the ceiling plate side.

Subsequently, the place downstream side of the liquid paths of the bonded product, namely 0.150 mm downstream side from the position where the discharge energy generating elements were located, was cut vertically to the liquid path by means of a commercially available dicing saw (trade name: DAD 2H/6 Model, manufactured by DISCO) to form orifices for discharging the liquid for recording.

Finally, the cut surface was washed and then dried, followed further by polishing of the cut surface to effect smoothening and mounting of the feeding pipes of the liquid for recording on the thru-holes to complete the liquid jet recording head. The recording heads obtained were all found to have excellent dimensional precision with liquid paths and liquid chambers reproducing faithfully the mask pattern. In this connection, the orifice dimensions were within the ranges of 80±5 μm×50±5 μm, and the orifice pitch within the range of 130±5 μm.

The quality and the durability during prolonged use of the recording heads thus prepared were tested as described below.

First, for the recording heads obtained, the durability test of performing the dipping treatment in the liquids for recording comprising the following compositions at 60° C. for 1000 hours (the environmental conditions comparable with those during the actual prolonged use of recording heads) was practiced.

Liquid components for recording

1) $H_2O$/diethylene glycol/1,3-dimethyl-2-imidazolidinone/C.I. Direct Blue 86*$^1$ (=57/30/10/3 parts by weight) pH=8.0

2) $H_2O$/diethylene glycol/N-methyl-2-pyrrolidone/C.I. Direct Black 154*$^2$ (=55/30/10/5 parts by weight) pH=9.0

3) $H_2O$/diethylene glycol/polyethylene glycol #400/N-methyl-2-pyrrolidone/C.I. Direct Yellow 86*$^3$ (=65/10/10/10/5 parts by weight) pH=7.0

4) $H_2O$/ethylene glycol/triethylene glycol/triethylene glycol monomethyl ether/C.I. Food Black 2*$^4$ (=67/10/15/5/3 parts by weight) pH=10.0.

The notes *1 to *4 are water-soluble dyes, and sodium hydroxide was employed for pH control.

After the durability test, for each of the heads practiced with the test, the bonding state of the cured dry film to the substrate and the cover was observed. As the result, no peel-off and damage was recognized at all in all the recording heads, thus exhibiting good close contact.

On the other hand, measurements of the viscosity and the surface tension of the ink used in the dipping treatment, measurement of the absorbance of the ink, and observation of generation of agglomerated product in the ink were respectively conducted. The surface tension was not substantially lowered, no change in absorbance recognized, and no generation of agglomerated product recognized with naked eyes. Accordingly, the ink used in the dipping treatment was filled in other heads for examination whether there is practical influence on discharge characteristics. As the result, in all the heads, normal printing was possible. From the above results, it can be understood that the recording head of the present invention comprises the structural member with little influence on the ink jet ink.

Next, separately, for 10 recording heads obtained, each head was mounted on the recording apparatus shown in FIG. 11, and the printing test was practiced, which performed printing by use of the liquid for recording as mentioned above by applying a recording signal of $10^8$ pulses on the recording head continuously for 14 hours. Concerning either recording head, immediately after initiation of printing and after elapse of 14 hours, substantially no lowering in performance was recognized in both discharging performance and print state of the liquid for recording, thus evidencing a recording head excellent in durability.

Also, the heads were disassembled after completion of the printing, and the dimensions of the discharge opening and the peripheral portion of the discharge energy generating element were measured. As the result, the change in dimension was $2\mu$ or less, substantially without change caused by the heat and pressure accompanied with bubbling, which have been the problems in the photosensitive resin of the prior art such as swelling, sinking, etc., thus exhibiting good state.

As described above, the active energy-ray-curing resin composition used in the constitution of the liquid jet recording head of the present invention comprises the graft copolymerized component (A) as the constituent and therefore has sufficient adhesion to various members without addition of an additive, and also contains the linear polymer (B) as the constituent and is therefore excellent in developing characteristics during pattern formation. Also, its cured film has sufficient chemical resistance and durability.

Further, the composition employs the graft copolymerized polymer and the linear polymer as the polymeric substances which are its constituents in combination, and therefore a coating with solvent resistance to the developer is obtained with less active energy irradiation as compared with the case when employing only the graft copolymerized polymer alone as the polymeric substance. As the result, the properties of the patterning process are improved, such that resolution can be improved and pattern formation can be effected without being influenced by the kinds or the states of the members, etc., whereby the working conditions width can be expanded.

Since the composition uses an epoxy resin as the active energy-ray-curing component, firstly the shrinkage duping curing is smaller as compared with the acrylic type, consequently having a specific feature of small residual strain. The second specific feature is that there is no chemical denaturation due to the ink jet ink, and at the same time the component dissolved into the ink is very little. From the above-mentioned two facts, the recording head is by far superior in durability both mechanically and chemically.

Therefore, the recording head of the present invention which employs the cured product of the composition as at least a part of its constitution is inexpensive and precise, and becomes higher in reliability. Also, by formation of the liquid path wall with the cured film of the composition, a recording head having the liquid path finely worked with good precision and good yield can be obtained.

Further, the recording head of the present invention, by having the constitution as described above, becomes higher in reliability and excellent in durability also when formed into a multi-orifice type.

We claim:

1. A process for producing a liquid jet recording head comprising a discharge opening for discharging a recording liquid, a liquid path communicating with the discharge opening and a discharge energy generating element aligned with the liquid path for generating an energy to discharge the recording liquid from the discharge opening, said process comprising the steps of:

applying an active energy-curing resin composition onto at least a part of a surface of a first member for forming a wall of the liquid path;

exposing the applied active energy-ray-curing resin composition to an active energy ray selected from the group consisting of an ultraviolet ray having an intensity of 1 mW/cm$^2$ to 100 mW/cm$^2$ and an electron beam with an intensity of 0.5M Rad to 20M Rad; and providing a second member on the exposed active energy-ray-curing resin composition;

wherein said first member or said second member has a discharge energy generating element provided thereon and the active energy-ray-curing resin composition comprises (a) a graft Copolymerized polymer having a number average molecular weight of 5,000 or more and a weight average molecular weight of 50,000 or less, which comprises a trunk chain composed mainly of structural units derived from at least one monomer selected from the group consisting of alkyl methacrylates, acrylonitrile and styrene and has graft chains having structural units derived from at least one monomer selected from the group consisting of monomers represented by the following formulae (x) and (y):

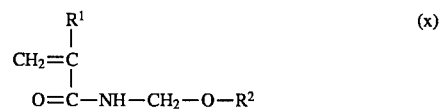

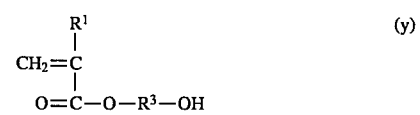

wherein $R^1$ is a hydrogen atom or an alkyl or hydroxyalkyl group having 1 to 3 carbon atoms, $R^2$ is a hydrogen atom or an alkyl or acyl group having 1 to 4 carbon atoms which may have hydroxy groups, $R^3$ is an alkyl group having 2 to 6 carbon atoms, a halogen-substituted alkyl group having 2 to 6 carbon atoms, an alkylether group represented by the formula:

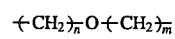

wherein $2 \leq m+n \leq 6$, $n \neq 0$, $n \neq 0$, or a phenylalkyl group represented by the formula:

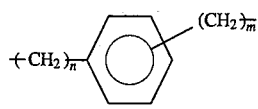

wherein $2 \leq m+n \leq 4$, or the case where $n \neq 0$ or $m \neq 0$ is contained;

(B) a linear polymer having a number average molecular weight of 50,000 or more and a weight average molecular weight of 350,000 or less and having a glass transition temperature of 60° C. or higher, which comprises (i) structural units derived from at least one monomer selected from the group consisting of methyl methacrylate, ethyl methacrylate, isobutyl methacrylate, t-butyl methacrylate, benzyl methacrylate, acrylonitrile, isobornyl methacrylate, isobornyl acrylate, tricyclodecane acrylate, tricyclodecane methacrylate, tricyclodecaneoxyethyl methacrylate, styrene, dimethylaminoethyl methacrylate and cyclohexyl methacrylate, and (ii) from 5 to 30 mol % of structural units derived from at least one monomer selected from the group consisting of the monomers represented by the formula (x) and the monomers represented by the formula (y);

(C) a resin comprising repeating units having at least one epoxy group in one molecule; and (D) a photopolymerization initiator capable of generating a Lewis acid by irradiation with an active energy ray.

2. The process according to claim 1, wherein the exposure with the active energy ray is carried out according to a desired pattern.

3. The process according to claim 2, wherein the exposure with the active energy ray is carried out by scanning the active energy-ray-curing resin composition with the active energy ray.

4. The process according to claim 2, wherein the exposure with the active energy ray is carried out via a photomask.

5. The process according to claim 1, further comprising a step of heat treatment at a temperature of 80° C. to 200° C. after the exposing step.

6. The process according to claim 1, wherein the active energy-ray-curing resin composition is liquid.

7. The process according to claim 6, wherein the active energy-ray-curing resin composition has a viscosity of 100 cp to 3000 cp.

8. The process according to claim 1, wherein the first member has a planar shape.

9. The process according to claim 1, wherein the second member has a planar shape.

10. The process according to claim 1, further comprising a step of developing the exposed active energy-ray-curing resin composition.

11. The process according to claim 1, further comprising a step of developing the exposed active energy-ray-curing resin composition before the step of providing the second member.

12. The process according to claim 1, wherein the discharge energy generating element is provided on the first member.

13. The process according to claim 1, wherein the discharge energy generating element is provided on the second member.

14. The process according to claim 1, wherein the active energy-ray-curing resin composition is applied onto the first member provided with the discharge energy generating element, the exposure with the active energy ray is carried out in a manner not corresponding to the position of the discharge energy generating element, the irradiated active energy-ray-curing resin composition is developed, whereby a part of the active energy-ray-curing resin composition is removed corresponding to the position of the discharge energy generating element.

15. The process according to claim 1, wherein the step of applying the active energy-ray-curing resin composition is carried out at a temperature of 40° C. to 130° C.

16. The process according to claim 1, wherein the active energy-ray-curing resin composition is solid.

17. The process according to claim 16, wherein the active energy-ray-curing resin composition is solidified by applying and drying the liquid active energy-ray-curing resin composition.

18. The process according to claim 1, wherein the discharge energy generating element is a heat generating element.

19. The process according to claim 1, wherein the weight ratio of the graft copolymerized polymer (A) to the linear polymer (B) is in a range of (A):(B)=80:20 to 50:50.

20. The process according to claim 19, wherein the ratio of the total weight of the graft copolymerized polymer (A), the linear polymer (B) and the resin (C) to the weight of the photopolymerization initiator (D) is in a range of ((A)+(B)+(C)): (D)=100:1 to 100:10.

21. The process according to claim 20, wherein the polymerization initiator (D) comprises at least one compound selected from the group consisting of aromatic halonium salt compounds. and aromatic onium salt compounds having photosensitivity and containing an element belonging to Group VIa or Group Va of the periodic table.

22. The process according to claim 19, wherein the polymerization initiator (D) comprises at least one compound selected from the group consisting of aromatic halonium salt compounds and aromatic onium salt compounds having photosensitivity and containing an element belonging to Group VIa or Group Va of the periodic table.

23. The process according to claim 19, wherein the ratio of the total weight of the graft copolymerized polymer (A) and the linear polymer (B) to the weight of the resin (C) is in a range of ((A)+(B)):(C)=100:50 to 100:200.

24. The process according to claim 23, wherein the ratio of the total weight of the graft copolymerized polymer (A), the linear polymer (B) and the resin (C) to the weight of the polymerization initiator (D) is in a range of ((A)+(B)+(C)):(D)=100:1 TO 100:10.

25. The process according to claim 23, wherein the polymerization initiator (D) comprises at least one compound selected from the group consisting of aromatic halonium salt compounds and aromatic onium salt compounds having photosensitivity and containing an element belonging to Group VIa or Group Va of the periodic table.

26. The process according to claim 1, wherein the ratio of the total weight of the graft copolymerized polymer (A) and the linear polymer (B) to the weight of the resin (C) is in a range of ((A)+(B)):(C)=100:50 to 100:200.

27. The process according to claim 26, wherein the polymerization initiator (D) comprises at least one compound selected from the group consisting of aromatic halonium salt compounds and aromatic onium salt compounds having photosensitivity and containing an element belonging to Group VIa or Group Va of the periodic table.

28. The process according to claim 26, wherein the ratio of the total weight of the graft copolymerized polymer (A), the linear polymer (B) and the resin (C) to the weight of the photopolymerization initiator (D) is in the range of ((A)+(B)+(C)):(D)=100:1 to 100:10.

29. The process according to claim 1, wherein the ratio of the total weight of the graft copolymerized polymer (A), the linear polymer (B) and the resin (C) to the weight of the photopolymerization initiator (D) is in a range of ((A)+(B)+(C)):(D)=100:1 to 100:10.

30. The process according to claim 29, wherein the polymerization initiator (D) comprises at least one compound selected from the group consisting of aromatic halonium salt compounds and aromatic onium salt compounds having photosensitivity and containing an element belonging to Group VIa or Group Va of the periodic table.

31. The process according to claim 1, wherein the polymerization initiator (D) comprises at least one compound selected from the group consisting of aromatic halonium salt compounds and aromatic onium salt compounds having photosensitivity and containing an element belonging to Group VIa or Group Va of the periodic table.

* * * * *

UNITED STATES PATENT AND TRADEMARK OFFICE
CERTIFICATE OF CORRECTION

PATENT NO. : 5,578,418
DATED : November 26, 1996
INVENTOR(S) : Hiromichi NOGUCHI, et al.

It is certified that error appears in the above-indentified patent and that said Letters Patent is hereby corrected as shown below:

COLUMN 1
Line 41, "as" should read --as a--.

Line 42, "element," should read --element or--.

COLUMN 2
Line 22, "satisfied" should read --satisfy--.

Line 33, "problem that" should read --problems as--.

COLUMN 3
Line 9, "remained" should read --remains--.

COLUMN 4
Line 28, "use." should read --use--.

Line 54, "a.t" should read --at--.

Lines 66-67, "raono-mers" should read --monomers--.

COLUMN 5
Line 34, "toohomer" should read --monomer--.

UNITED STATES PATENT AND TRADEMARK OFFICE
CERTIFICATE OF CORRECTION

PATENT NO. : 5,578,418
DATED : November 26, 1996
INVENTOR(S) : Hiromichi NOGUCHI, et al.

It is certified that error appears in the above-indentified patent and that said Letters Patent is hereby corrected as shown below:

COLUMN 6
 Line 41, "consisting" should read --consisting of--.

COLUMN 7
 Line 21, "Comprising" should read --comprising--.

COLUMN 8
 Line 65, "addtion" should read --addition--.

Line 66, "the0copolymerization" should read --the copolymerization--.

COLUMN 9
 Line 17, "(5')," should read --(5),--.

Line 24, "toohomer" should read --monomer--.

COLUMN 10
 Line 20, "representd" should read --represented--.

COLUMN 11
 Line 12, "butyl," should read --butyl--.

Line 13, "ether" should read --ether,--.

Line 27, "compositionto" should read --composition to--.

UNITED STATES PATENT AND TRADEMARK OFFICE
CERTIFICATE OF CORRECTION

PATENT NO. : 5,578,418
DATED : November 26, 1996
INVENTOR(S) : Hiromichi NOGUCHI, et al.

It is certified that error appears in the above-indentified patent and that said Letters Patent is hereby corrected as shown below:

COLUMN 11 (cont.)
Line 31, "the groups" should read --Group--.

Line 35, "publication" should read --Publication--.

Line 36, "publi-" should read --Publi--.

COLUMN 12
Line 2, "(where in" should read --(wherein--.

COLUMN 17
Line 43, benzoin. ethyl" should read --benzoin ethyl--.

Line 57, "Co.):" should read --Co.),--.

Line 58, "Co.):" should read --Co.),--.

COLUMN 18
Line 7, "polymer A" should read --polymer (A)--.

COLUMN 19
Line 42, "onto..a" should read --onto a--.

COLUMN 20
Line 48, "thus" should read --this--.

Line 56, "abovedescribed" should read --above-described--.

UNITED STATES PATENT AND TRADEMARK OFFICE
CERTIFICATE OF CORRECTION

PATENT NO. : 5,578,418
DATED : November 26, 1996
INVENTOR(S) : Hiromichi NOGUCHI, et al.

It is certified that error appears in the above-indentified patent and that said Letters Patent is hereby corrected as shown below:

COLUMN 21
    Line 16, "thermoserring" should read --thermosetting--.

Line 25, "limited" should read --limited to--.

Line 30, "squeezy" should read --squeegee--.

Line 34, "squeezy" should read --squeegee--.

Line 50, "and" should read --and 6B--.

Line 55, "so called" should read --so-called--.

COLUMN 22
    Line 56, "118 a" should read --118. A--.

Line 60, "or" should read --for--.

COLUMN 23
    Line 25, "polyer" should read --polymer--.

Line 55, "A" should read --An--.

COLUMN 24
    Line 44, "methylethy" should read --methylethyl--.

UNITED STATES PATENT AND TRADEMARK OFFICE
CERTIFICATE OF CORRECTION

PATENT NO. : 5,578,418

DATED : November 26, 1996

INVENTOR(S) : Hiromichi NOGUCHI, et al.

It is certified that error appears in the above-indentified patent and that said Letters Patent is hereby corrected as shown below:

<u>COLUMN 24 (cont.)</u>
    Line 53, "linear" should read --linear acrylic copolymer is one that has a number average molecular--.

Lines 55-56, delete "acrylic copolymer is one that has a number average molecular".

Line 58, "A" should read --An--.

<u>COLUMN 25</u>
    Line 1, "A." should read --A--.

Line 31, "($HfB_2$)]and" should read --($HfB_2$)] and--.

Line 59, delete "of".

<u>COLUMN 26</u>
    Line 50, "86*[1] (=57/30/10/3" should read --86*[1] ¶ (=57/30/10/3--.

Line 53, "154*[2] (=55/30/10/5" should read --154*[2] ¶ (=55/30/10/5--.

Line 55, "86*[3] (=65/10/10/" should read --86*[3] ¶ (=65/10/10/--.

UNITED STATES PATENT AND TRADEMARK OFFICE
CERTIFICATE OF CORRECTION

| | |
|---|---|
| PATENT NO. : | 5,578,418 |
| DATED : | November 26, 1996 |
| INVENTOR(S) : | Hiromichi NOGUCHI, et al. |

It is certified that error appears in the above-indentified patent and that said Letters Patent is hereby corrected as shown below:

COLUMN 26 (cont.)
  Line 58, "monomethy1" should read --monomethyl--.

Line 58, "$2*^4$ (=67/10/15/5/3" should read --$2*^4$ ¶ (=67/10/15/5/3--.

COLUMN 27
  Line 6, "recognized" should read --was recognized--.

Line 7, "recognized" should read --was recognized--.

Line 57, "duping" should read --during--.

COLUMN 28
  Line 34, "Copolymerized" should read --copolymerized--.

Line 65, "n≠0," (second occurrence) should read --m≠0,--.

COLUMN 30
  Line 29, "compounds." should read --compounds--.

Line 46, "TO" should read --to--.

Signed and Sealed this

Fifteenth Day of July, 1997

Attest:

BRUCE LEHMAN

*Attesting Officer*   *Commissioner of Patents and Trademarks*